United States Patent [19]
Ker et al.

[11] Patent Number: 6,002,568
[45] Date of Patent: Dec. 14, 1999

[54] ESD PROTECTION SCHEME FOR MIXED-VOLTAGE CMOS INTEGRATED CIRCUITS

[75] Inventors: Ming-Dou Ker, Hsinchu; Hun-Hsien Chang, Taipei, both of Taiwan

[73] Assignee: Taiwan Semiconductor Manufacturing Co., Ltd., Taiwan

[21] Appl. No.: 09/106,115

[22] Filed: Jun. 29, 1998

[51] Int. Cl.$^6$ ........................................................ H02H 3/00
[52] U.S. Cl. ............................ 361/111; 361/56; 361/113; 361/118; 361/127
[58] Field of Search ................................. 361/56, 58, 91, 361/111, 113, 117, 118, 119, 127, 100, 115

[56] References Cited

U.S. PATENT DOCUMENTS 5,576,557  11/1996  Ker ............................................ 361/111

Primary Examiner—Stephen W Jackson
Attorney, Agent, or Firm—Harold L. Novick; Nath & Associates

[57] ABSTRACT

In this invention, a whole-chip ESD protection scheme with the SCR string or the SCR/diode-mixed string are proposed to protect the mixed-voltage CMOS IC's against the ESD damage. The SCR string or the SCR/diode-mixed string is placed between the separated power lines. The ESD current is arranged to be discharged through the SCR string or the SCR/diode-mixed string and the ESD clamps between the power lines. Therefore, the internal circuits and the interface circuits between the circuits with different power supplies can be prevented from ESD damages. The number of the SCR's or the diodes in the SCR string or the SCR/diode-mixed string connected between the different power lines is dependent on the voltage difference between the different power supplies in the mixed-voltage CMOS IC's. When the IC is in the normal operating conditions, such SCR string or the SCR/diode-mixed string between the different power lines is kept off to maintain the independence of the power supplies in the mixed-voltage COMS IC.

24 Claims, 23 Drawing Sheets

6,002,568

ESD PROTECTION SCHEME FOR MIXED-VOLTAGE CMOS INTEGRATED CIRCUITS

CROSS REFERENCE TO RELATED APPLICATIONS

This invention is related to a filed U.S. Patent application entitled "Cascode LVTSCR and ESD protection circuit" assigned to same assignee with the same inventor as the present application and incorporated herein by reference in their entirety.

FIELD OF THE INVENTION

The present invention relates to an ESD (electrostatic discharge) protection circuit, and more specifically, to an ESD protection scheme for mixed-voltage CMOS integrated circuits.

BACKGROUND OF THE INVENTION

As more circuits and functions are integrated into a single chip, a chip often has more power pins to supply the sufficient current for circuit operations. For different applications, the voltage levels of the high-state voltage sources VDD or VCC of the IC's are different. For example, the VDD in the typical 0.35-$\mu$m CMOS technology with the gate-oxide thickness of 70 angstroms has been scaled down to 3.3V. However, the IC's with the gate-oxide thickness of 140 angstroms can be operated with a voltage of 5V. Therefore, the IC's in the system application may have the different power supplies with different voltage levels. Such IC's have been called as the mixed-voltage IC's.

Due to the difference of the voltage levels, the power lines and power pins in the IC's have to be separated. However, such a CMOS IC with separated power pins and separated power lines in the chip has been reported that the interface circuits are more sensitive to ESD (electrostatic discharge) damages, even if there are suitable ESD protection circuits placed around the input and output pads of the IC. The details are disclosed in the following references.

[1] N. Maene, J. Vandenbroeck, and L. Bempt, "On chip electrostatic discharge protections for inputs, outputs, and supplies of CMOS circuits," Proc. of EOS/ESD Symp., 1992, pp. 228–233.

[2] M. D. Ker and T. L. Yu, "ESD protection to overcome internal gate-oxide damage on digital-analog interface of mixed-mode CMOS IC's", Journal of Microelectronics and Reliability, vol. 36, no. 11/12, 1996, pp. 1727–1730.

[3] M. D. Ker, C. Y. Wu, T. Cheng, M. Wu, T. L. Yu, and A. Wang, "Whole-chip ESD protection for CMOS VLSI/ULSI with multiple power pins," Proc. of 1994 IEEE International Integrated Reliability Workshop, USA, Oct. 16–19, 1994, pp. 124–128.

[4] M.-D. Ker, C.-Y. Wu, H.-H. Chang, and T.-S. Wu, "Whole-chip ESD protection scheme for CMOS mixed-mode IC's in deep-submicron CMOS technology," Proc. of IEEE Custom Integrated Circuits Conference, Santa Clara, Calif., USA, May 5–8, 1997, pp. 31–34.

ESD stress may happen across any two pins of a CMOS IC. The ESD current may enter into the IC through an input or an output pin, and then go out the IC from another input or output pin. So, in the ESD testing standard, the pin-to-pin ESD stress has been specified as an ESD testing condition. The reference below introducing the ESD testing standard can be referenced.

[5] EOS/ESD Standard for ESD Sensitivity Testing, EOS/ESD Association, Inc., N.Y., 1993.

In the pin-to-pin ESD testing condition, the positive or negative ESD voltages are applied to a pin and the other input and output pins are grounded, but all pins of the voltage sources VDD and VSS are floating. This pin-to-pin ESD testing condition often causes some unexpected ESD damages on the internal circuits which beyond the protection of the input or output ESD protection circuits.

A schematic diagram of the pin-to-pin ESD testing is shown in FIG. 1. A positive ESD voltage is applied to an input pin or input pad 10*i* of circuit I with higher power supplies VDDH and VSSH, another output pin or output pad 12*o* of circuit II with lower power supplies VDDL and VSSL is relatively grounded. In such pin-to-pin ESD testing, VDDH, VSSH, VDDL, and VSSL are all floating. In FIG. 1, the CMOS IC has two circuits, circuit I and circuit II. Circuit I is supplied by the power supplies of VDDH and VSSH, whereas circuit II is supplied by the power supplies of VDDL and VSSL. VDDH is separated from the VDDL, and VSSH is separated from the VSSL. Circuit I and circuit II are connected by interface circuits 14 to transfer the signal message between circuit I and circuit II in the CMOS IC. As shown in FIG. 1, the ESD current $I_{ESD}$ is diverted into the VDDH power line through the diode Dpl in the input ESD protection circuit of circuit I. Since the output pad of circuit II is grounded, the initial voltage level on the VDDL and VSSL power lines is also relatively grounded. The ESD current may be conducted through circuit I into the VSSH power line. Therefore, the ESD stress voltage between the input pad 10*i* of circuit I and the output pad 12*o* of circuit II will become across between the power lines of VDDH/VSSH and the power lines of VDDL/VSSL. Such ESD voltage is therefore discharged through the interface circuits 14 and causes the ESD damages. Thus, the interface circuits between the separated power lines in a mixed-voltage CMOS IC are dangerous to such pin-to-pin ESD stress. The ESD protection circuits around the input pads and the output pads can not protect such unexpected damages located at the interface circuits 14 of a mixed-voltage CMOS with separated power pins and power lines.

A solution to ESD reliability in a CMOS IC is illustrated in FIG. 2. An extra ESD cell 16*a* is used to connect the separated VDDH and VDDL power lines and another extra ESD cell 16*b* is used to connect the separated VSSH and VSSL power lines. To protect the internal circuits of circuit I, an ESD clamp 18*a* is placed between the VDDH and VSSH power lines. To protect the internal circuits of circuit II, another ESD clamp 18*b* is placed between the VDDL and VSSL power lines. Thus the interface circuits 14 can be free of ESD damages during the pin-to-pin ESD stress.

To clearly explain the protection scheme of FIG. 2, the pin-to-pin ESD stress on such IC has been illustrated in FIG. 3*a* and FIG. 3*b*. In FIG. 3*a*, the positive ESD voltage is applied to an input pad 10*i* of circuit I and an output pad 12*o* of circuit II is relatively grounded. The ESD current is still diverted into the VDDH power line, but the ESD voltage on the VDDH power line can be discharged through the ESD cell 16*a* to the VDDL. On the other hand, the ESD voltage on the VDDH power line can be also discharged through the ESD cell 16*b* between the VSSH and VSSL power lines. Finally, the ESD current discharging paths are shown as dashed lines in FIG. 3*a*.

In FIG. 3*b*, the positive ESD voltage is applied to an output pad 12*o* of circuit II and an input pad 10*i* of circuit I is relatively grounded. The ESD current is still diverted into the VDDL power line, but the ESD voltage on the VDDL power line can be discharged through the ESD cell 16*a* to the VDDH. On the other hand, the ESD voltage on the VDDL power line can be also discharged through the ESD cell 16b between the VSSH and VSSL power lines. Finally, the ESD current is discharged through the ESD cells 16a and 16b through the input pad 10i to ground. Thus the interface circuits 14 can be protected against ESD damages.

From aforementioned ESD protection scheme, the ESD cell between the VDDH and VDDL has to provide the bi-directional current paths to bypass the ESD current from VDDH to VDDL and the ESD current from VDDL to VDDH in the ESD stress conditions. But such ESD cell also has to block the VDDH and VDDL power supplies due to the different voltage levels when the IC is in the normal operating conditions. Some prior arts had been designed by using the series diodes to connect the separated power lines in a CMOS IC, like the references listed below.

[6] S. Dabral, R. Aslett, and T. Maloney, "Designing on-chip power supply coupling diodes for ESD protection and noise immunity," in Proc. of EOS/ESD Symp., 1993, pp. 239–249.

[7] T. Maloney and S. Dabral, "Novel clamp circuits for IC power supply protection, " in Proc. of EOS/ESD Symp., 1995, pp. 1–12.

[8] H. Nguyen and J. Walker, "Electrostatic discharge protection system for mixed voltage application specific integrated circuit design," U.S. Pat. No. 5,616,943, April, 1997.

One typical design of such prior arts is shown in FIG. 4, where a plurality of diodes are connected from the VDDH to the VDDL of the CMOS IC. For a CMOS IC with a 5V VDDH and a 3V VDDL, four diodes 20a, 20b, 20c, and 20d have to be placed in the diode string to block the voltage difference between the VDDH and VDDL power lines. A diode 22a is also used to connect the separated power lines from the 3V VDDL to the 5V VDDH. Both the VSSH and VSSL are grounded when the IC is in the normal operating conditions. The ESD cell to connect the separated VSSH and VSSL power lines is also realized by the two diodes 24a and 26a in a back-to-back connection.

The diode string in FIG. 4 can be replaced by the NMOS string to connect the separated power lines of the CMOS IC. A prior art of such design is shown in FIG. 5 with four NMOS transistors Mn2a, Mn2b, Mn2c, Mn2d. The diodes can also be replaced by the PMOS Mp2a, Mp2b, Mp2c, Mp2d to perform the same function, as shown in FIG. 6. The number of the diode-connection NMOS or PMOS between the VDDH and VDDL power lines is dependent on the voltage difference between the VDDH and VDDL.

Another design to overcome such ESD issue is shown in FIG. 7, where a PMOS Mp1 with its parasitic drain-to-bulk diode Dp1 is used to connect the VDDH and VDDL power lines of the CMOS IC. In FIG. 8, the field-oxide device 28, or thick-oxide device as called, is used to connect the VDDH and VDDL, as illustrated in the above identified reference [8]. The similar designs by using the diodes, MOS's, BJT's, or field-oxide devices (FOD's) to connect the separated power lines in a CMOS IC is also reported in several US patents and papers as follows.

[9] J. Kuo, "ESD protection scheme," U.S. Pat. No. 5,196,981, March, 1993.

[10] J. Leach, "Method of forming an electrostatic discharge protection circuit," U.S. Pat. No. 5,290,724, March, 1994.

[11] W. Miller, "Electrostatic discharge protection for CMOS integrated circuits," U.S. Pat. No. 5,301,084, April, 1994.

[12] W. Reczek and H. Terletzki, "Integrated semiconductor circuit with ESD protection," U.S. Pat. No. 5,426,323, June, 1995.

[13] T. Maloney, "Electrostatic discharge protection circuits using biased and terminated PNP transistor chains," U.S. Pat. No. 5,530,612, June, 1996.

[14] S. Voldman, "Power sequence independent electrostatic discharge protection circuits," U.S. Pat. No. 5,610,791, March, 1997.

[15] S. Voldman, "Voltage regulator bypass circuit," U.S. Pat. No. 5,625,280, April, 1997.

[16] E. Worley, et al., "Sub-micron chip ESD protection schemes which avoid avalanching junctions," in Proc. of EOS/ESD Symp., 1995, pp. 13–20.

To protect the CMOS IC's against the ESD stresses, the ESD protection circuits are generally added to the input and output pins. To overcome the ESD damages caused by the VDD-to-VSS ESD stress, the ESD clamp device has been added between the VDD and VSS power lines of the IC products. But, to effectively protect the mixed-voltage CMOS IC with separated power lines, some suitable ESD cells have to be placed between the separated power lines of the mixed-voltage CMOS IC to avoid the ESD damage locating at the interface circuits between the circuits supplied by different power lines.

SUMMARY OF THE INVENTION

The present invention proposes an electrostatic discharge protection circuit. The electrostatic discharge protection circuit includes a first voltage source, a second voltage source, and one or more first SCR's (silicon controlled rectifiers). The first SCR's is coupled in series by coupling a cathode of one of the first SCR's to an anode of next one of the first SCR's. A first anode of the first SCR's is coupled to the first voltage source and a last cathode of the first SCR's is coupled to the second voltage source. Each of the first SCR's has an anode coupled with a control gate for NSCR's (NMOS-triggering SCR's), and has a cathode coupled with a control gate for PSCR's (PMOS-triggering SCR's).

The electrostatic discharge protection circuit can further includes one or more diodes coupled in parallel with the first SCR's. The diodes are coupled in series with a first p-junction of the diodes being coupled to the second voltage source and a last n-junction of the diodes being coupled to the first voltage source.

Alternatively with the diodes, the electrostatic discharge protection circuit can includes one or more second SCR's coupled in parallel with the first SCR's. The second SCR's are coupled in series by coupling a cathode of one of the second SCR's to an anode of next one of the second SCR's. A first anode of the second SCR's is coupled to the second voltage source and a last cathode of the second SCR's is coupled to the first voltage source. Each of the second SCR's has an anode coupled with a control gate for the NSCR's, and has a cathode coupled with a control gate for the PSCR's.

In the preferred embodiments, the first and second SCR's can be LVTSCR's (low-voltage triggering SCR's) for the circuit design in the present invention.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

Figure 1:
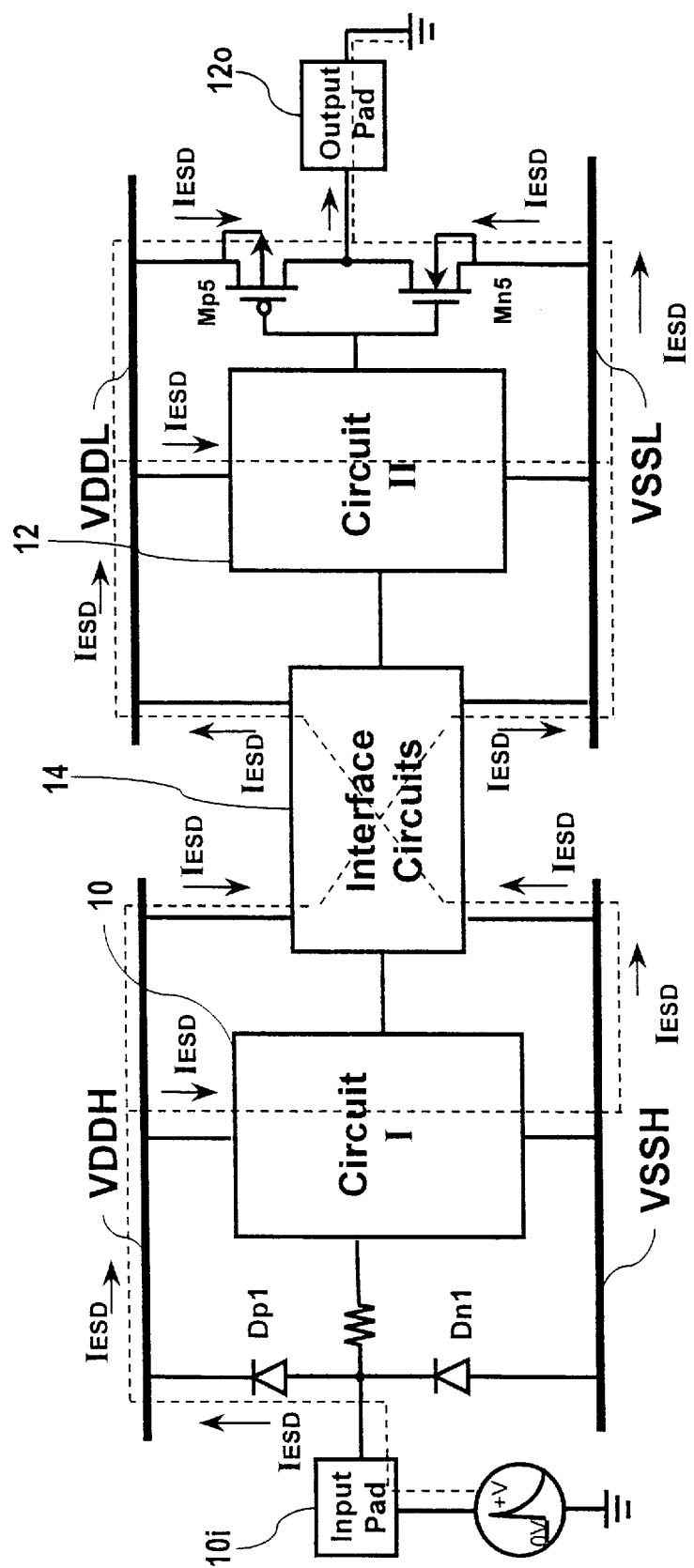
FIG. 1 is a schematic diagram of the pin-to-pin ESD testing.
Figure 2:
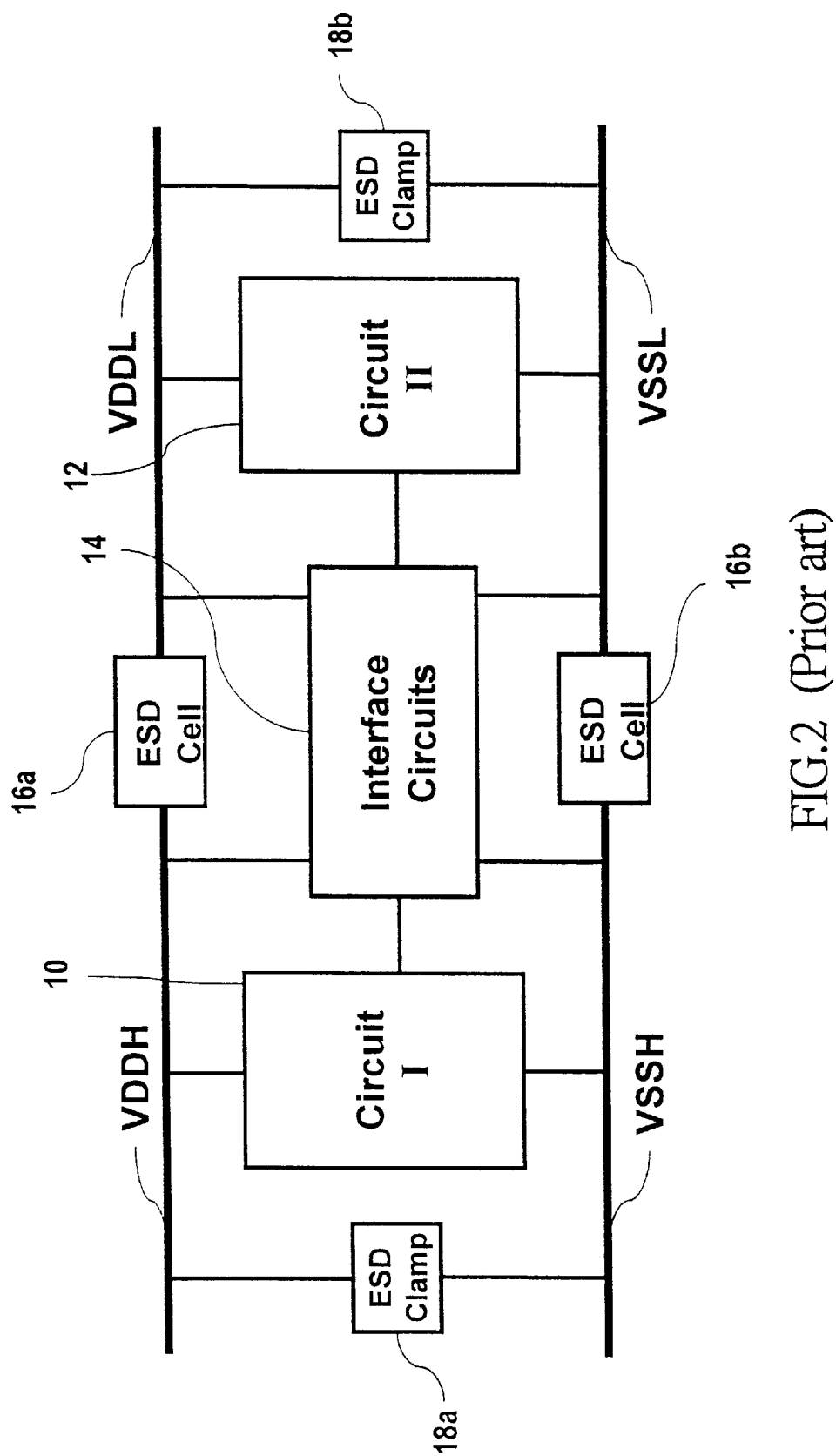
FIG. 2 illustrates a schematic diagram of a solution to ESD reliability problem in a CMOS IC.

The present invention provides a whole-chip ESD protection scheme employing a SCR string or a SCR/diode-mixed string to protect the mixed-voltage CMOS IC's against the ESD damage. The SCR string or the SCR/diode-mixed string are placed between the separated power lines. The pin-to-pin ESD stress can be dissipated through the SCR string or the SCR/diode-mixed string and the ESD clamp devices between the power lines. Therefore, the internal circuits and the interface circuits between the circuits with different power supplies can be protected from the ESD damages.

A SCR (silicon controlled rectifier) device in the CMOS processes has a holding voltage as low as about 1V. Due to the low holding voltage, the SCR device has a lower power dissipation during the ESD stress than other ESD protection devices, such as diode, MOS, BJT, or FOD in CMOS technologies. Therefore, the SCR device can sustain a much higher ESD level within smaller layout area in the CMOS IC's. The SCR devices had been used as the main ESD clamp devices in several input ESD protection circuits. The SCR device often has a higher trigger voltage of about 30V in the submicron CMOS technology, which is generally greater than the gate-oxide breakdown voltage of about 20V of the input stages. Therefore, the SCR device needs a secondary protection circuit to perform the overall ESD protection function. In order to effectively protect the output buffer by using the SCR device, the LVTSCR (low-voltage triggering SCR) device has been invented to lower the trigger voltage of the SCR device, as disclosed in the following works.

[17] A. Chatterjee and T. Polgreen, "A low-voltage triggering SCR for on-chip ESD protection at output and input pads," Proc. Symp. On VLSI Technology, 1990, pp. 75–76.

[18] A. Chatterjee and T. Polgreen, "A low-voltage triggering SCR for on-chip ESD protection at output and input pads," IEEE Electron Device Letters, vol. 12, pp. 21–22, January 1991.

The LVTSCR device for on-chip ESD protection with excellent ESD protection efficiency had been well studied and designed in many papers or patents listed below.

[19] M. D. Ker, et al., "Complementary-LVTSCR ESD protection circuit for submicron CMOS VLSI/ULSI," IEEE Trans. Electron Devices, pp. 588–598, 1996.

[20] M. D. Ker, H. H. Chang, and C. Y. Wu, "A gate-coupled PTLSCR/NTLSCR ESD protection circuit for deep-submicron low-voltage CMOS IC's," IEEE Journal of Solid-State Circuits, vol. 32, no. 1, pp. 38–51, January 1997.

[21] L. Metz, G. Motley, and G. Rieck, "Electrostatic discharge protection circuit for integrated circuits," U.S. Pat. No. 5,400,202, March, 1995.

[22] L. Metz and G. Motley, "Electrostatic discharge protection circuit for integrated circuits," U.S. Pat. No. 5,452,171, September, 1995.

[23] T. Polgreen, A. Chatterjee, and P. Yang, "Low voltage triggering semiconductor controlled rectifiers," U.S. Pat. No. 5,465,189, November, 1995.

[24] W. Au and M. Tong, "Electrostatic discharge suppression circuit employing low-voltage triggering silicon-controlled rectifier," U.S. Pat. No. 5,528,188, June, 1996.

[25] M. D. Ker and T. S. Wu, "CMOS on-chip four-LVTSCR ESD protection scheme," U.S. Pat. No. 5,572,394, November, 1996.

[26] M. D. Ker, C. Y. Wu, H. H. Chang, C. Y. Lee, and J. Ko, "Complementary-LVTSCR ESD protection circuit for sub-micron CMOS integrated circuits," U.S. Pat. No. 5,576, 557, November, 1996.

[27] J. Quiqley and D. Mietus, "Input/Output electrostatic discharge protection circuit for an integrated circuit," U.S. Pat. No. 5,610,425, March, 1997.

In the previous design of using SCR or LVTSCR devices, the SCR or LVTSCR devices are only placed from the input or output pads to the VSS (or even VDD) power lines to perform the ESD protection for the input stages or output buffers around the input or output pads.

In this invention, the SCR string is first used to protect the interface circuits of the mixed-voltage CMOS IC's with separated power pins. The SCR string is located between the separated power lines to perform the real whole-chip ESD protection.

Figure 9:
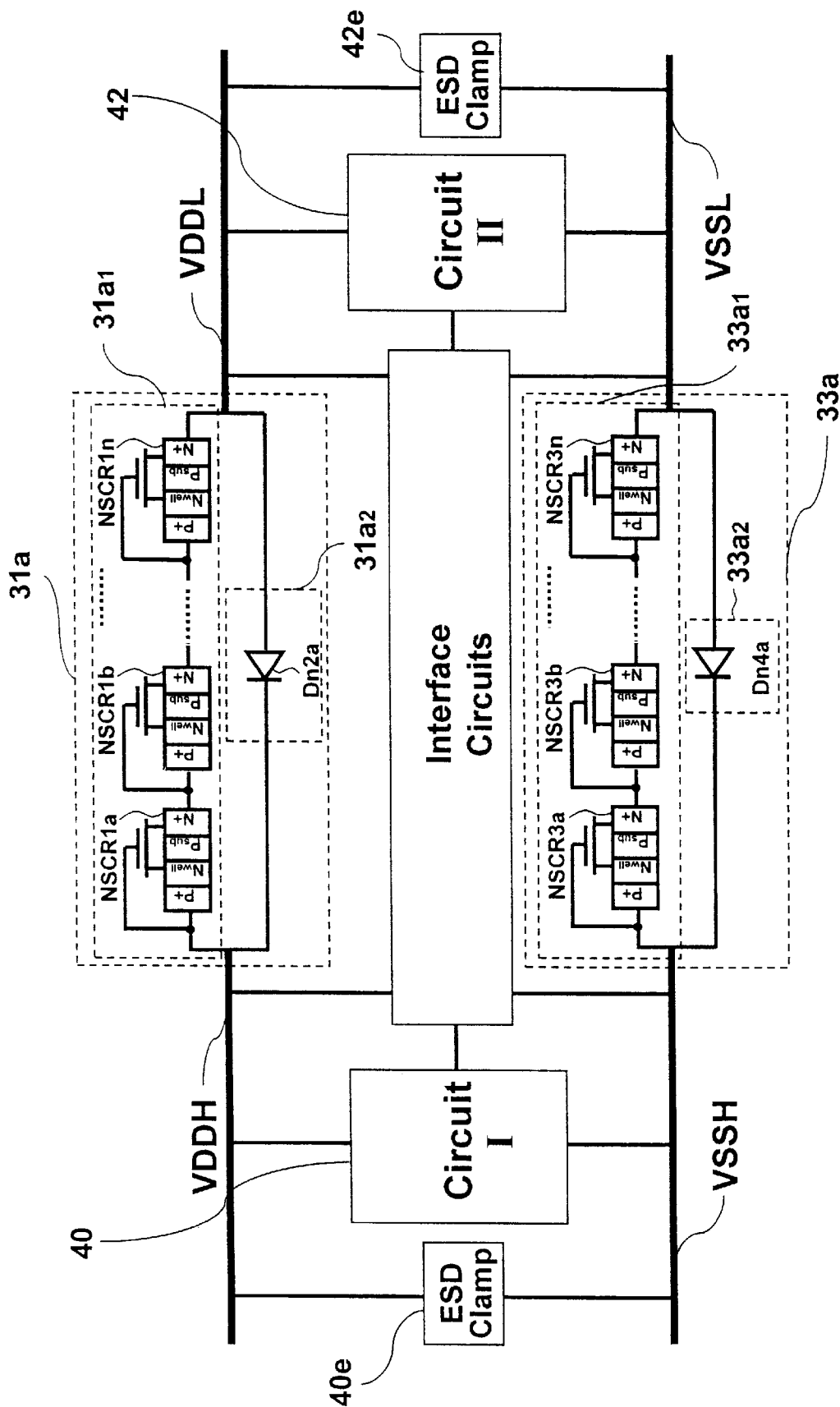
FIG. 9 illustrates an ESD protection circuit employing NSCR's in the SCR string in accordance with the present invention.

Turning to FIG. 9, an ESD protection circuit 31a between independent power supplies of the present invention is illustrated. The ESD protection circuit 31a includes a first voltage source VDDH, a second voltage source VDDL, and a first SCR string 31a1 including one or more SCR's (silicon controlled rectifiers), like NSCR1a, and NSCR1b, to NSCR1n. In the preferred embodiments, LVTSCR's (low-voltage triggering SCR's) are utilized as indicated in the FIG. The first SCR string 31a1 has NSCR1a, and NSCR1b, to NSCR1n which are connected in series by coupling a cathode of one of the SCR's to an anode of next one of the SCR's. A first anode of the SCR's, namely the anode of NSCR1a, is coupled to the first voltage source VDDH. A last cathode of the SCR's, namely the cathode of NSCR1n, is coupled to the second voltage source VDDL. For NSCR's (NMOS-triggered SCR's) like NSCR1a and NSCR1b to NSCR1n illustrated in the FIG., each of the SCR's has an anode coupled with a control gate. However, if the PSCR's (PMOS-triggered SCR's) are used alternatively, each of the SCR's has a cathode coupled with a control gate, which will be illustrated later. The first SCR string 31a1 provides an ESD current bypassing path from the first voltage source VDDH to the second voltage source VDDL.

In the case of providing VDDH as the first voltage source and VDDL as the second voltage source. The first voltage source VDDH and the second voltage source VDDL are high-state or positive-state voltage sources of a mixed-voltage circuit. The first voltage source VDDH has a higher voltage than the second voltage source VDDL. Since the holding voltage of the NSCR is about 1V. The number of the NSCR's in the SCR string between the VDDH and VDDL is dependent on the voltage difference between VDDH and VDDL. As an illustrative example, VDDH can be 5V and VDDL can be about 3V. Thus three NSCR's in the SCR string in the example can fully block the current between VDDH and VDDL in normal operating conditions. The independence of the power supplies under normal operating conditions can be maintained.

For providing an ESD current bypassing path in another direction from the second voltage source VDDL to the first voltage source VDDH, the electrostatic discharge protection circuit can further includes a second string 31a2 which has one or more diodes coupled in parallel with the first SCR string 31a1. In the case, since the second voltage source VDDL is maintained at a lower voltage than the first voltage source VDDH, one diode Dn2a is sufficient to block VDDH and VDDL in normal operating conditions. But if circuit is designed to have the circuit I (40) power-off and operate solely the circuit II (42), such as a partial power-off (circuit I off) mode in a green or a power saving design, more diodes are needed in the second string 31a2. The diodes are connected in series, wherein a first p-junction of the at least one diode is coupled to the second voltage source VDDL and a last n-junction of the at least one diode is coupled to the first voltage source VDDH.

Under the normal operating conditions of the CMOS IC, the SCR string of three NSCR's (NSCR1a, NSCR1b, and NSCR1n) and the diode Dn2a can fully block the current between VDDH and VDDL to maintain the independence of the individual power supplies. In the ESD stress conditions, the three NSCR's and the diode Dn2a can provide the ESD current discharging paths between VDDH and VDDL.

In the same way, another ESD protection circuit 33a with similar construction is placed between VSSH and VSSL, as shown in FIG. 9. The ESD protection circuit 33a has a first string 33a1 and a second string 33a2. In the case, VSSH is provided as the first voltage source and VSSL is provided as the second voltage source. The first voltage source VSSH and the second voltage source VSSL can be low-state or zero-state voltage sources of a mixed-voltage circuit. The ESD protection circuit is designed with the same construction with the first string 33a1 of SCR's and the parallel connected second string 33a2 of diode or diodes. The first SCR string 33a1 includes one or more NSCR's (NSCR3a and NSCR3b to NSCR3n,) wherein the number of SCR devices is dependent on the voltage difference needed between VSSH and VSSL to block the path at normal operating conditions, as illustrated above.

Figure 10:
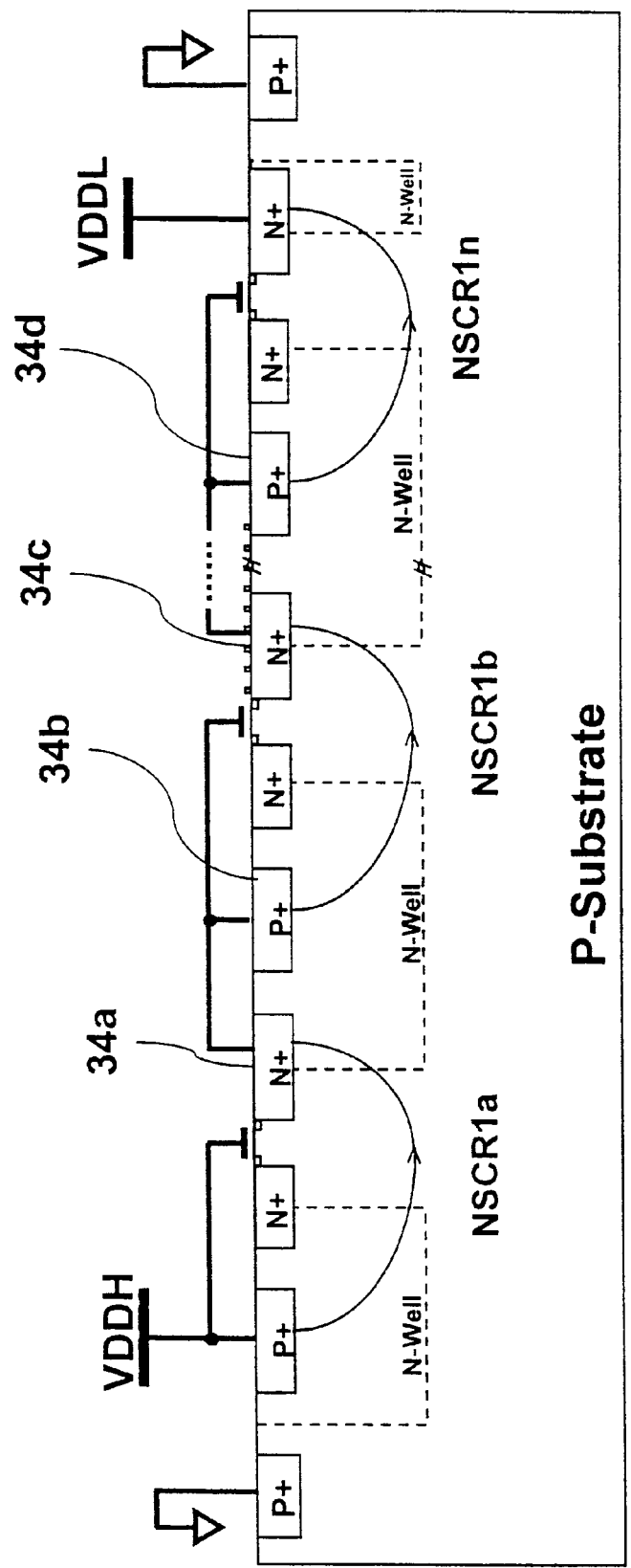
FIG. 10 illustrates a cross-sectional view of the SCR string using NSCR's in accordance with the present invention.

Referring to FIG. 10, a cross-sectional view of the SCR string using NSCR's is shown. As shown in the figure, each of the MOS-triggered silicon controlled rectifier (SCR) is consisting of a lateral SCR with an inserted triggering MOS (metal oxide semiconductor) transistor. It is shown that the SCR devices employed are constructed without employing a bipolar junction transistor and a resistor. The cathode 34a of the NSCR1a is merged into the anode 34b of the next NSCR1b, whereas the cathode 34c of the NSCR1b is merged into the anode 34d of the next NSCR1n, by respectively sharing a common N-well. The layout area of the SCR string with the NSCR's can be saved by this merged design.

Figure 11:
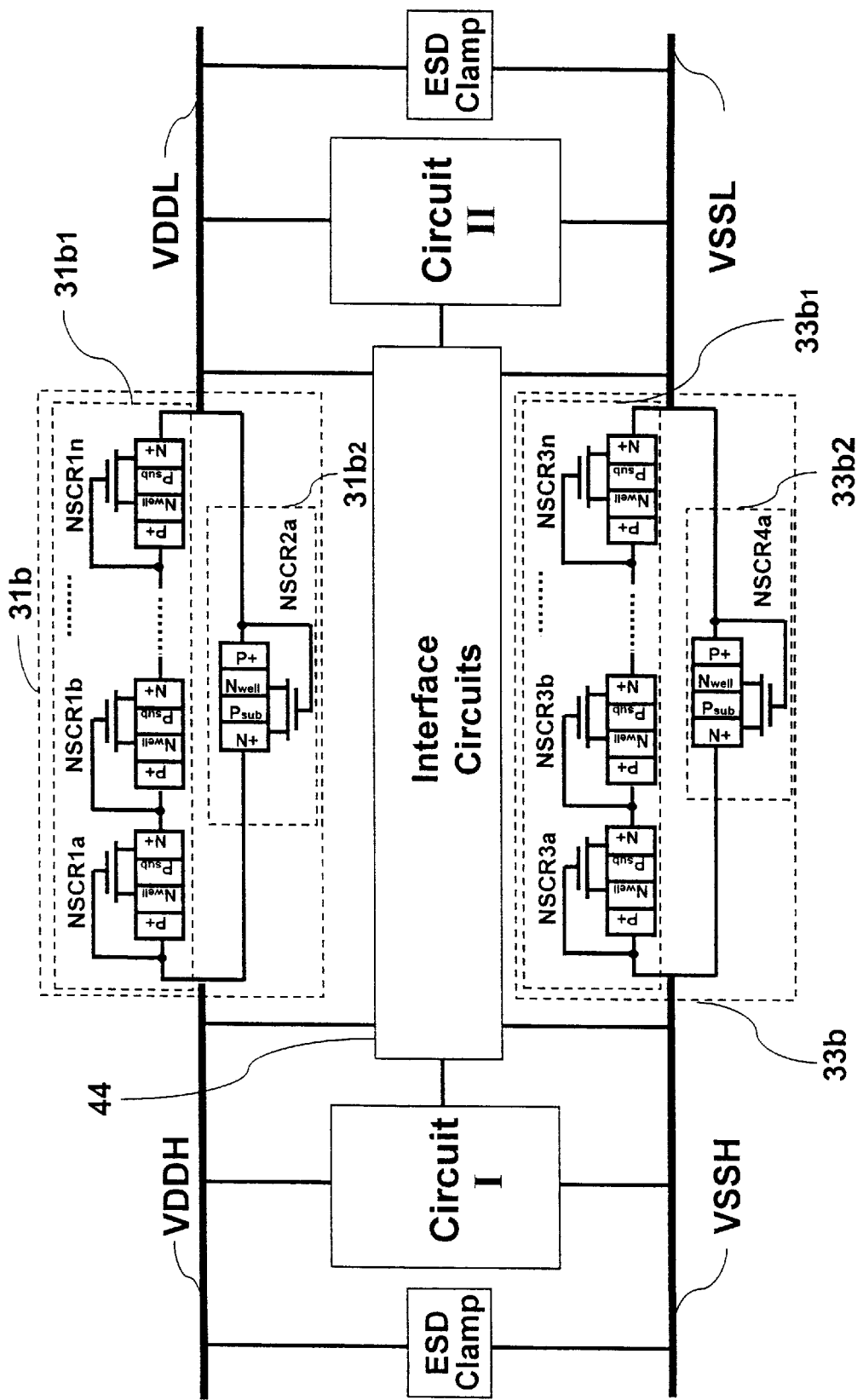
FIG. 11 illustrates an ESD protection circuit implemented all by NSCR's in accordance with the present invention.

The second string 31a2 and 33a2 of Dn2a and Dn4a in FIG. 9 can be respectively replaced by SCR devices NSCR2a and NSCR4a, as shown in FIG. 11. In the preferred embodiments, LVTSCR's (low-voltage triggering SCR's) are utilized in the same way. The first string 31b1 and 33b1 remains unchanged. One or more SCR devices like NSCR2a and NSCR4a are utilized respectively as the second string 31b2 and 33b2 to couple in parallel with the first string 31b1 and 33b1. The SCR's in the second string 31b2 and 33b2, when employed with multiple SCR's in one string, is coupled in the same way as the SCR devices in the first string 31b1 and 33b1 . But a first anode of the SCR's in the second string 31b2 or 33b2 is coupled to the second voltage source and a last cathode of the SCR's is coupled to the first voltage source.

In the ESD protection circuit 31b, NSCR2a provides an ESD current bypassing path in an opposite direction with that provided by the first string 31b1, namely in the direction from the second voltage source VDDL to the first voltage source VDDH. The effect of NSCR4a in the ESD protection circuit 33a is similar for providing current bypassing path in an opposite direction from VSSL to VSSH. Thus the ESD protection circuit 31b and 33b in FIG. 11 are realized all by the NMOS-triggered SCR devices.

When the IC is in the normal operating conditions with the power supplies, VDDH and VDDL have different voltage levels to supply the circuit operations in the mixed-voltage CMOS IC. Because the total holding voltage of NSCR's (NSCR1a, and NSCR1b, to NSCR1n) in the SCR string connected from VDDH to VDDL is greater than the voltage difference between VDDH and VDDL, the NSCR's in the SCR string are essentially kept off. The SCR device can be kept in the turn-on state only if the supplied voltage across the SCR device is greater than its holding voltage, such as the condition under ESD stress. Therefore, the ESD current can be discharged through the ESD protection circuit 31b and 33b without causing ESD damages located at the interface circuits 44 of the mixed-voltage CMOS IC.

OTHER EMBODIMENTS OF THE PRESENT INVENTION

To provide the ESD current discharging paths between the separated power lines, other implementations of the concept of the present invention are shown in FIG. 12 through FIG. 20.

Figure 12:
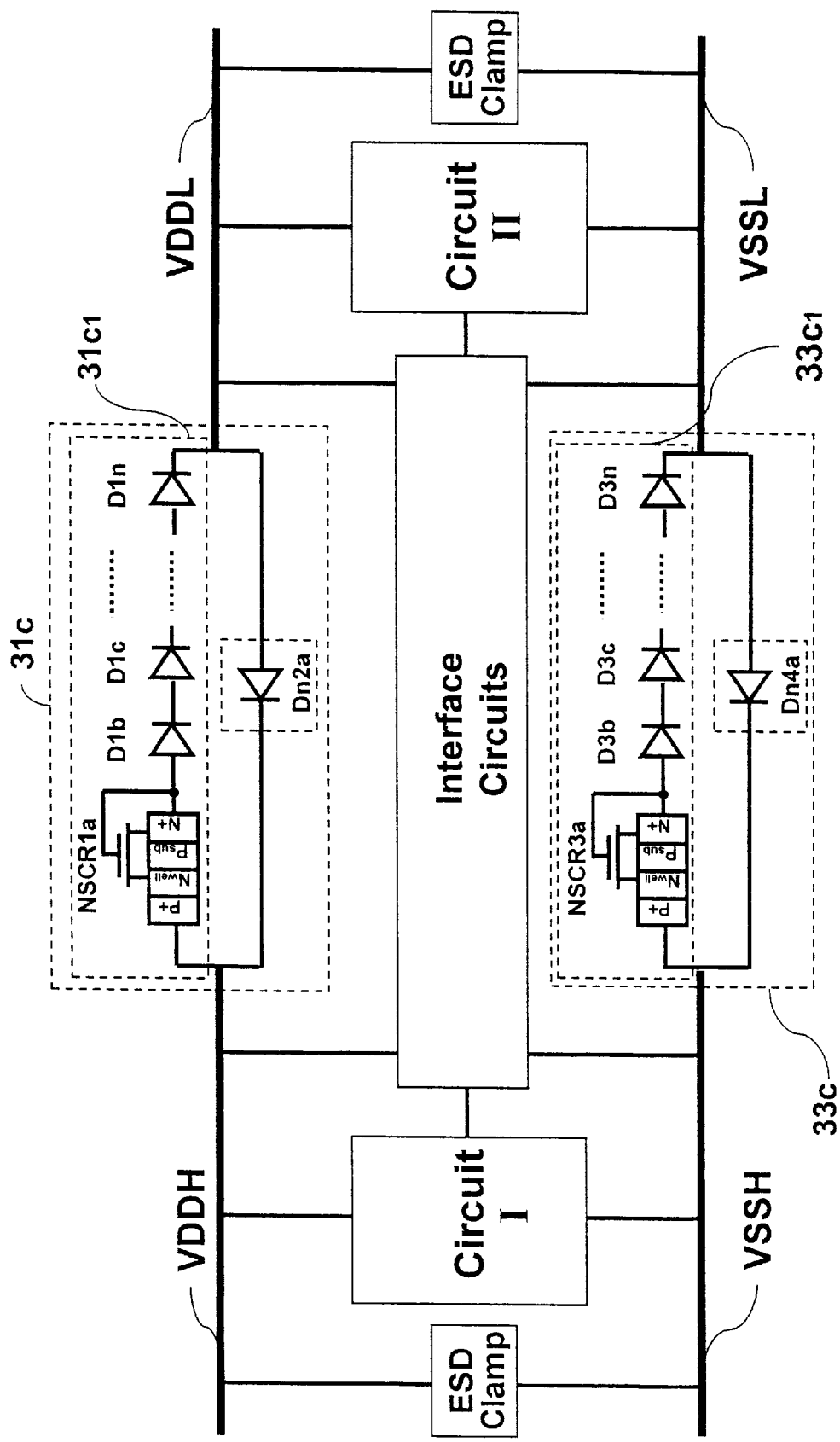
FIG. 12 illustrates an ESD protection circuit with the first string implemented by NSCR/diode-mixed string in accordance with the present invention.
Figure 13:
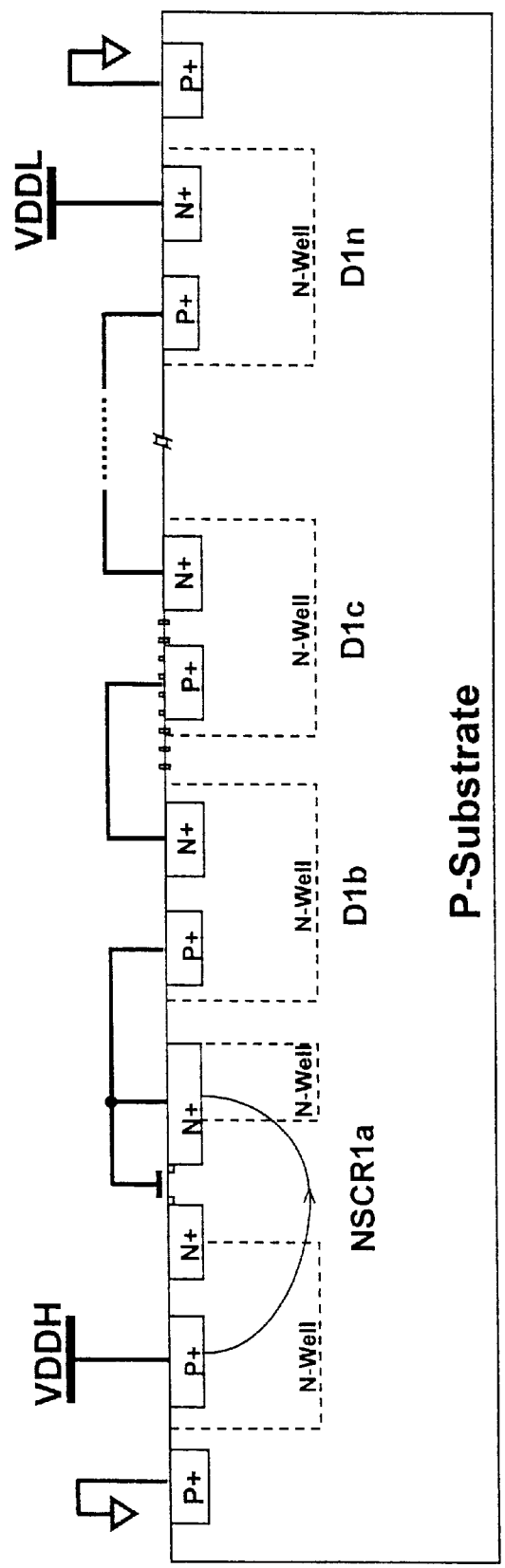
FIG. 13 illustrates a cross-sectional view of the NSCR/diode-mixed string in accordance with the present invention.

Referring to FIG. 12, the first string 31c1 in the ESD protection circuit 31c for the high-state voltage supplies VDDH and VDDL can be implemented by SCR or SCR's with one or more diodes added. In the case, a NMOS-triggered SCR NSCR1a and a diode string of diodes (D1b, and D1c to D1n) are used. The diodes are coupled in series between the second voltage source VDDL and the last cathode of the SCR, namely the cathode of NSCR1a. The first p-junction, namely p-junction of diode D1b, is coupled to the last cathode and a last n-junction, namely n-junction of diode D1n, is coupled to the second voltage source. The first string 33c1 in the ESD protection circuit 33c for the low-state voltage supplies VSSH and VSSL can be implemented in the same way with SCR or SCR's and one or more diodes added, as shown in the FIG. The number of SCR's and diodes used in one string is dependent on the voltage difference and the device characteristics. Thus, a great variety of constructions can be used. The device structures for the NSCR1a with the diode string which acts as the first string 31c1 and 33c1 is shown in FIG. 13.

Besides, the diode string can be coupled in series between the first voltage source and the first anode. The diodes are coupled in series with a first p-junction coupled to the first voltage source and a last n-junction coupled to the first anode.

Figure 14:
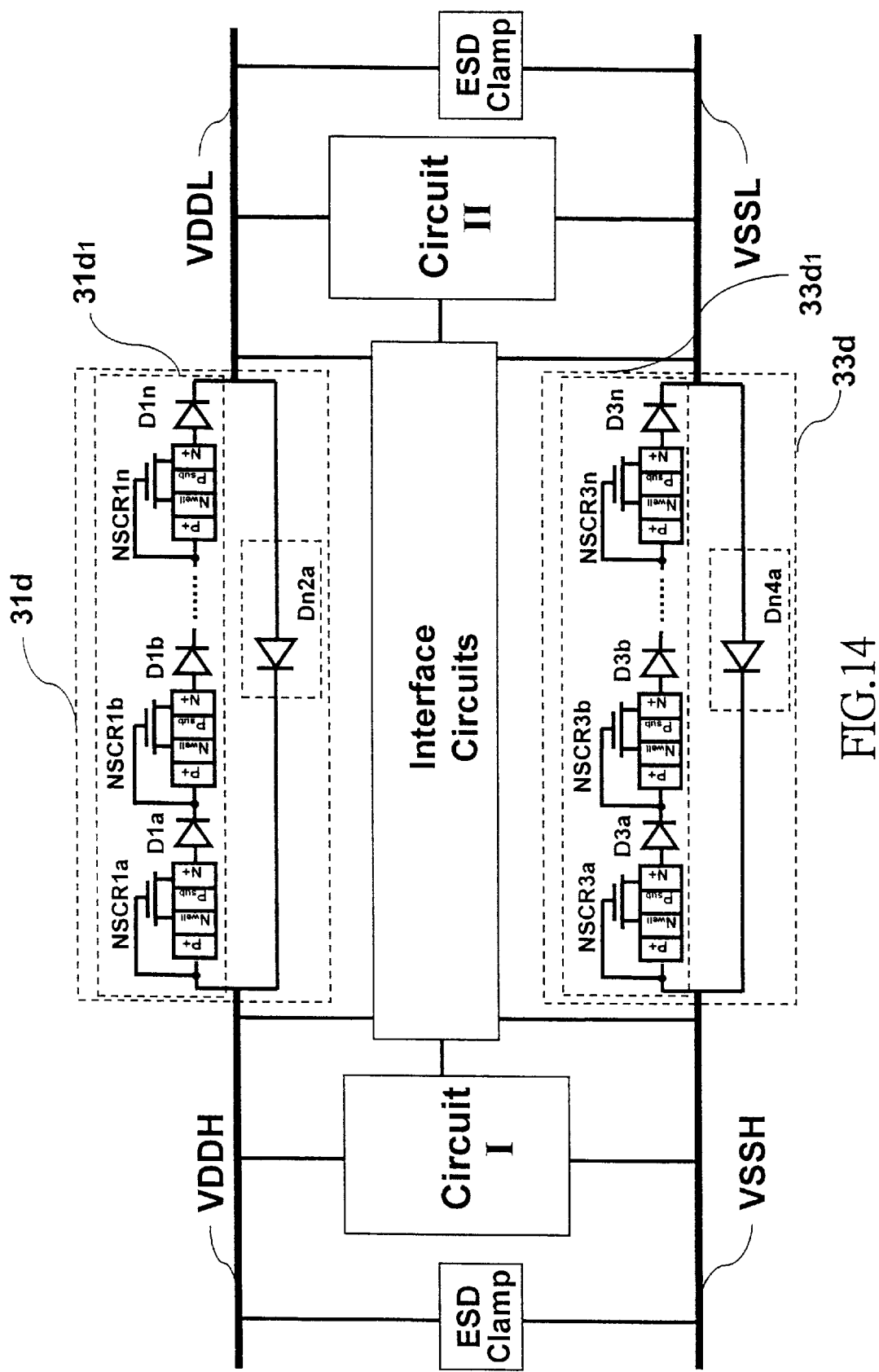
FIG. 14 illustrates an ESD protection circuit with the first string of NSCR's with diodes added between in accordance with the present invention.

Alternatively, the diodes in the first string 31c1 and 33c1 can be modified to be coupled between the SCR's, as the first string 31d1 and 33d1 shown in FIG. 14. The diodes (D1a, and D1b, to D1n) are coupled by connecting each p-junction to a cathode of a previous SCR and connecting each n-junction to an anode of a next SCR. The diodes (D3a, and D3b, to D3n) for the low-state voltage supplies are coupled in the same way.

Figure 15:
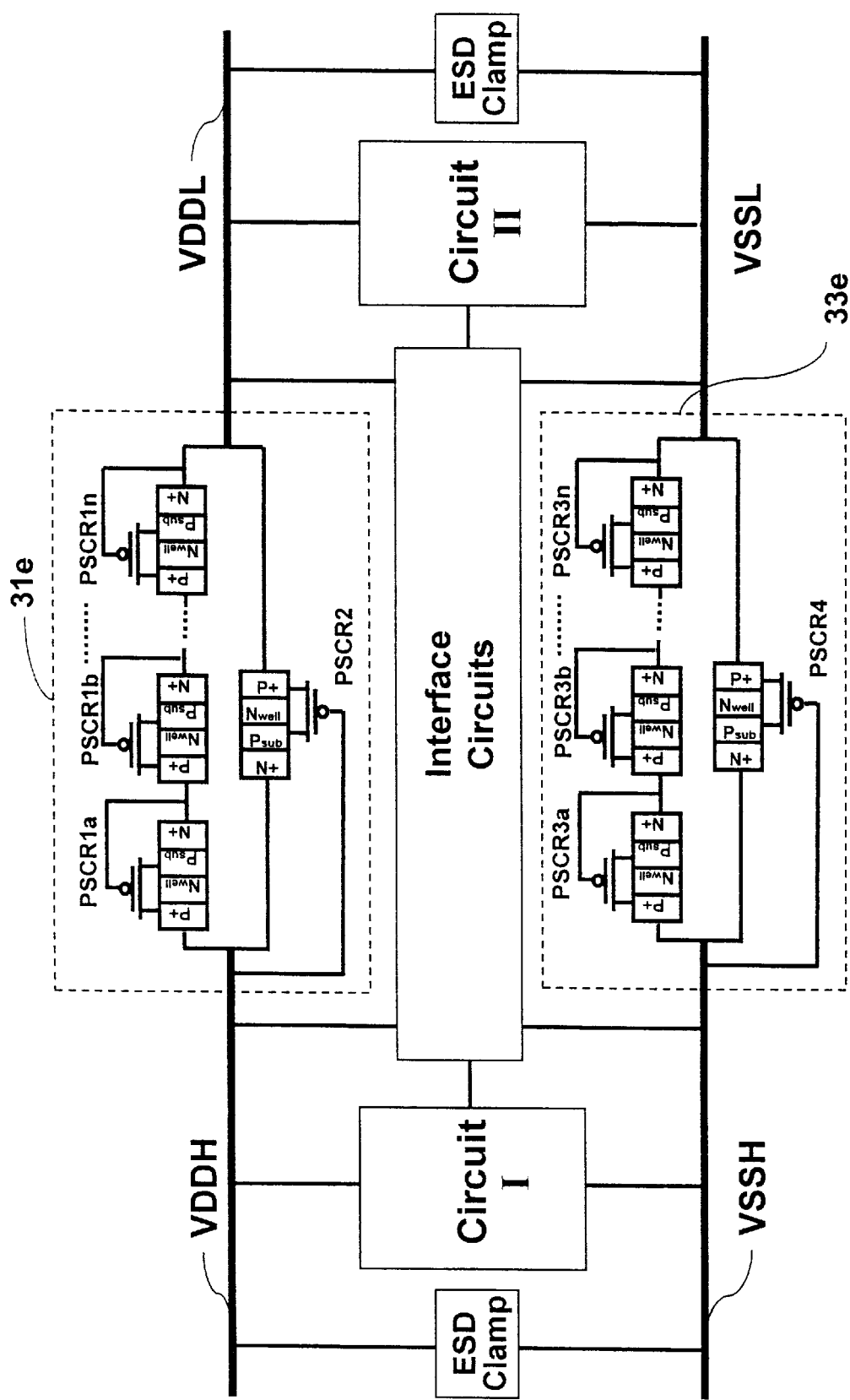
FIG. 15 illustrates an ESD protection circuit implemented all by PSCR's in accordance with the present invention.
Figure 16:
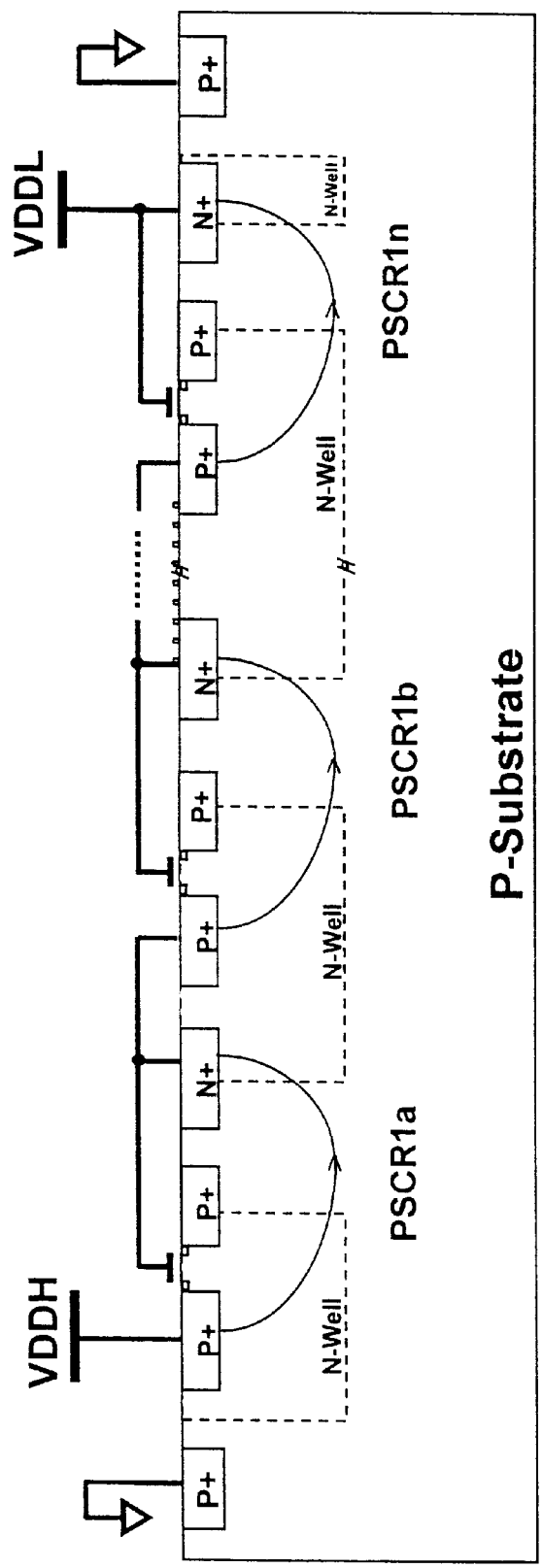
FIG. 16 illustrates a cross-sectional view of the PSCR string in accordance with the present invention.
Figure 17:
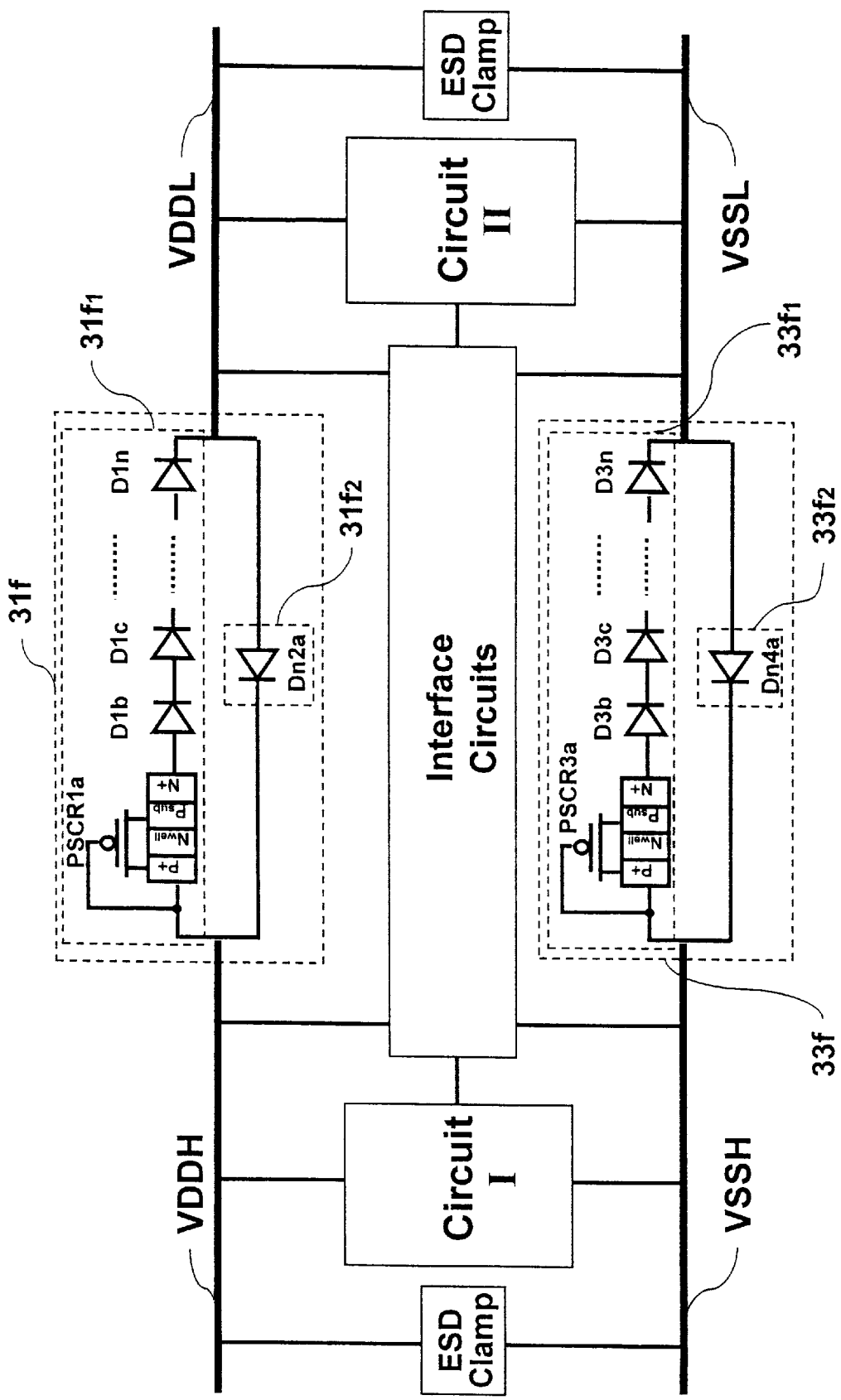
FIG. 17 illustrates an ESD protection circuit with the first string implemented by PSCR/diode-mixed string in accordance with the present invention.

The NSCR's of the ESD protection circuits 31b and 33b in FIG. 11 can be replaced with PSCR's, as shown in FIG. 15. For PMOS-triggered SCR's in the ESD protection circuits 31e and 33e, each PSCR's has a cathode coupled with a control gate, under the different device characteristics of PSCR's and NSCR's. The function of blocking path at normal operating conditions and providing current bypassing path under ESD stress is performed in the same way. The merged device structures for the PSCR's including PSCR1a, and PSCR1b, to PSCR1n is illustrated in FIG. 16. The cathode of PSCR1a is merged into the anode of PSCR1b, and so on.

Figure 18:
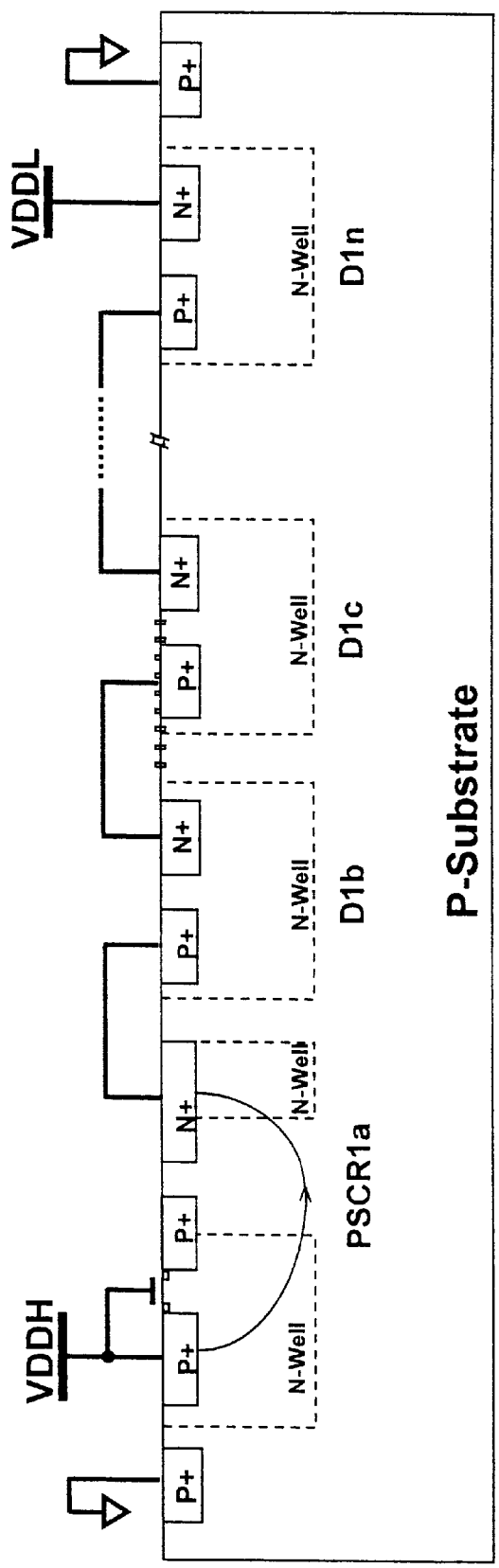
FIG. 18 illustrates a cross-sectional view of the PSCR/diode-mixed string in accordance with the present invention.
Figure 19:
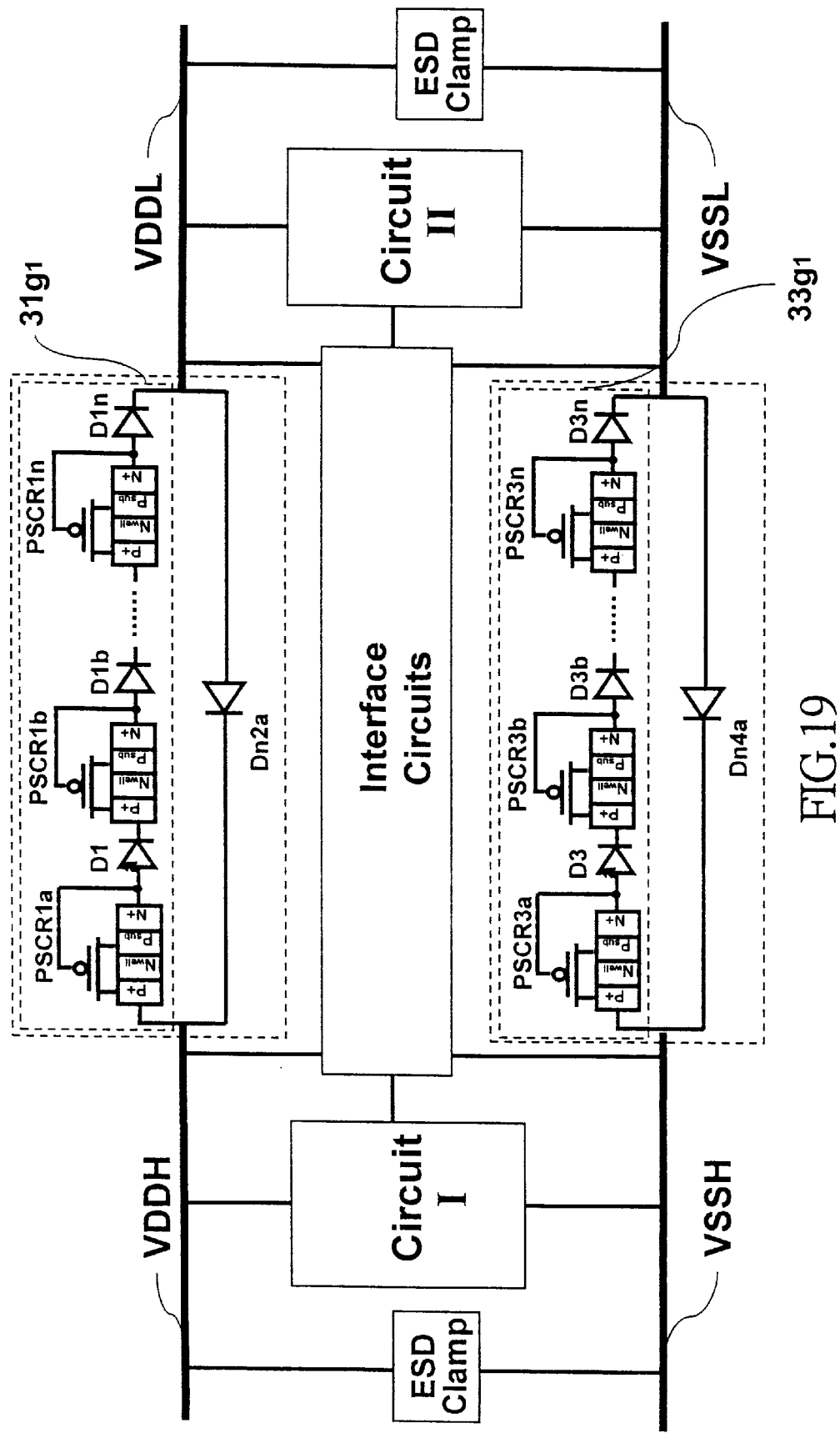
FIG. 19 illustrates an ESD protection circuit with the first string of PSCR's with diodes added between in accordance with the present invention.
Figure 20B:
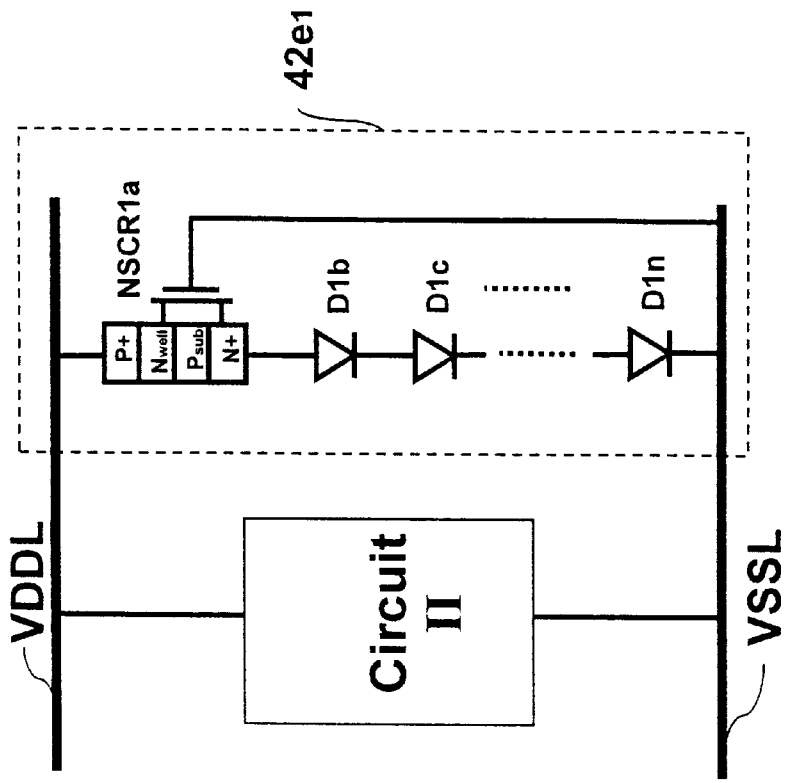
FIG. 20b illustrates an ESD clamp with NSCR/diode-mixed string for circuit II in accordance with the present invention.
Figure 20A:
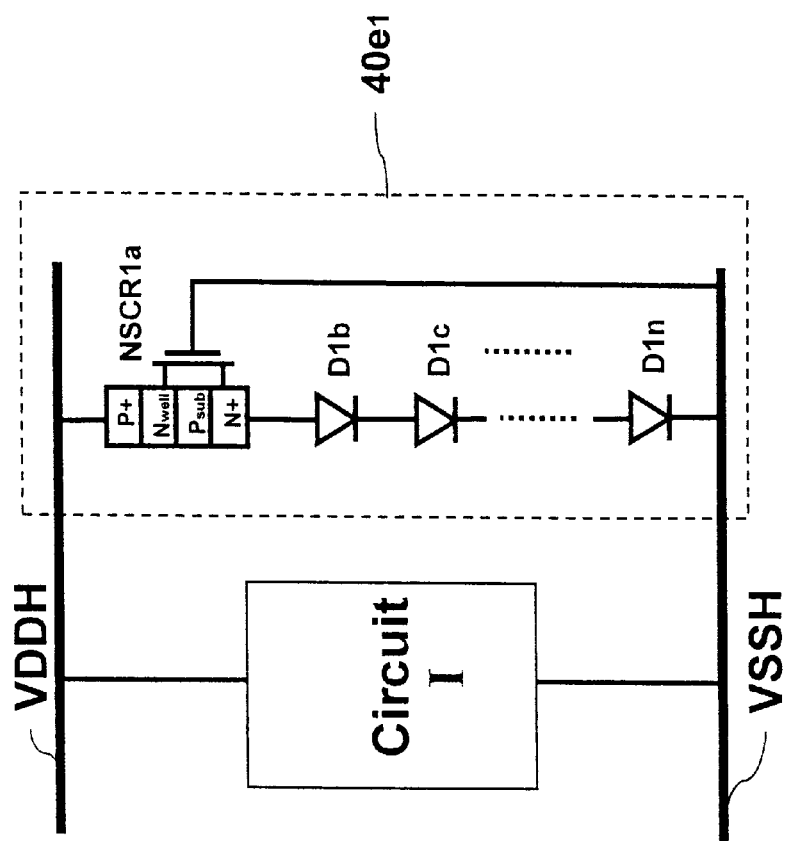
FIG. 20a illustrates an ESD clamp with NSCR/diode-mixed string for circuit I in accordance with the present invention.
Figure 20D:
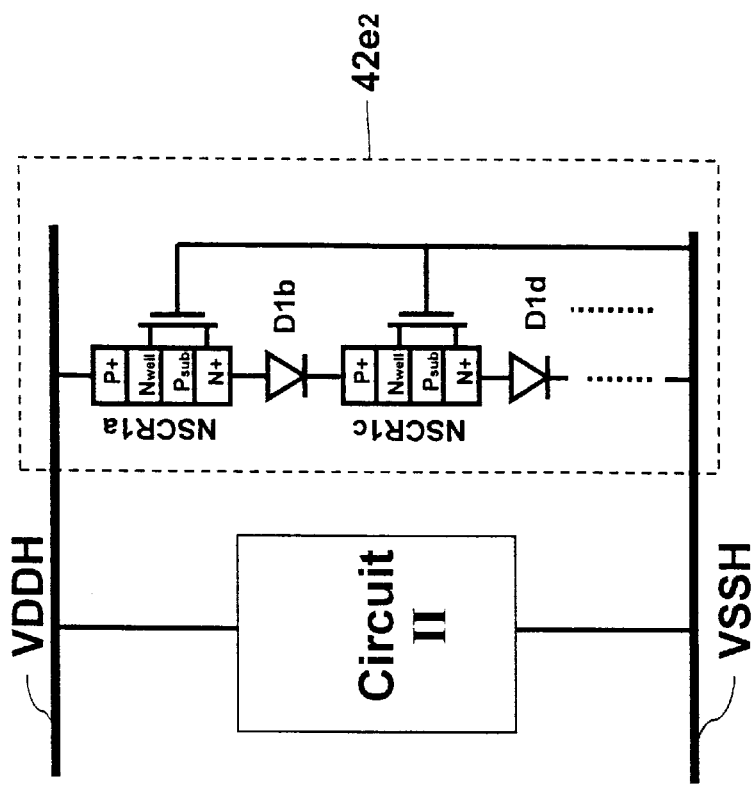
FIG. 20d illustrates an ESD clamp with NSCR's and diodes added between in accordance with the present invention.
Figure 20C:
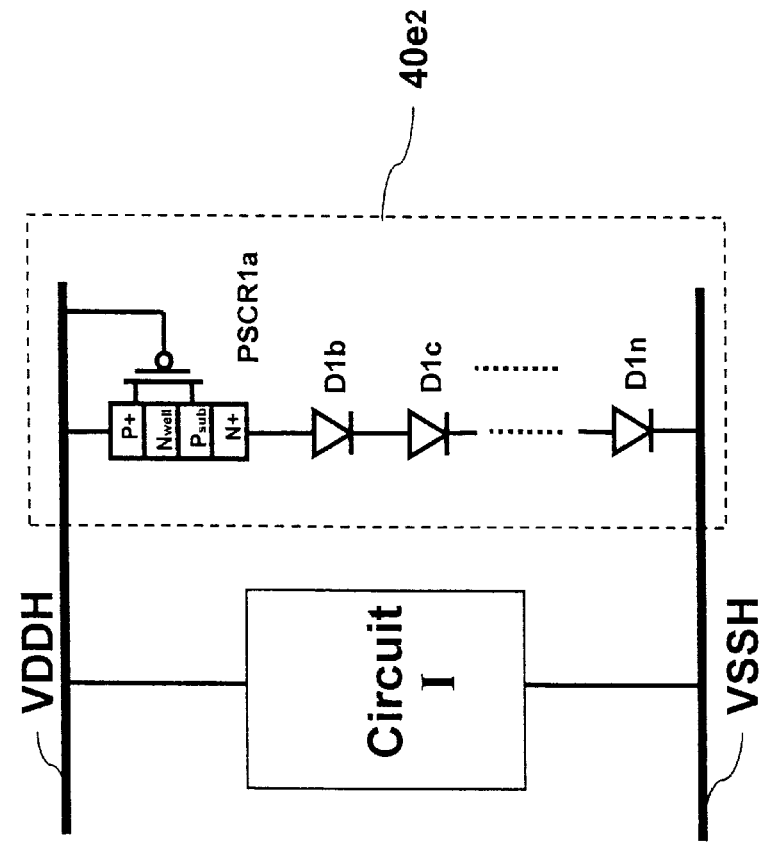
FIG. 20c illustrates an ESD clamp with PSCR/diode-mixed string for circuit I in accordance with the present invention.
Figure 20E:
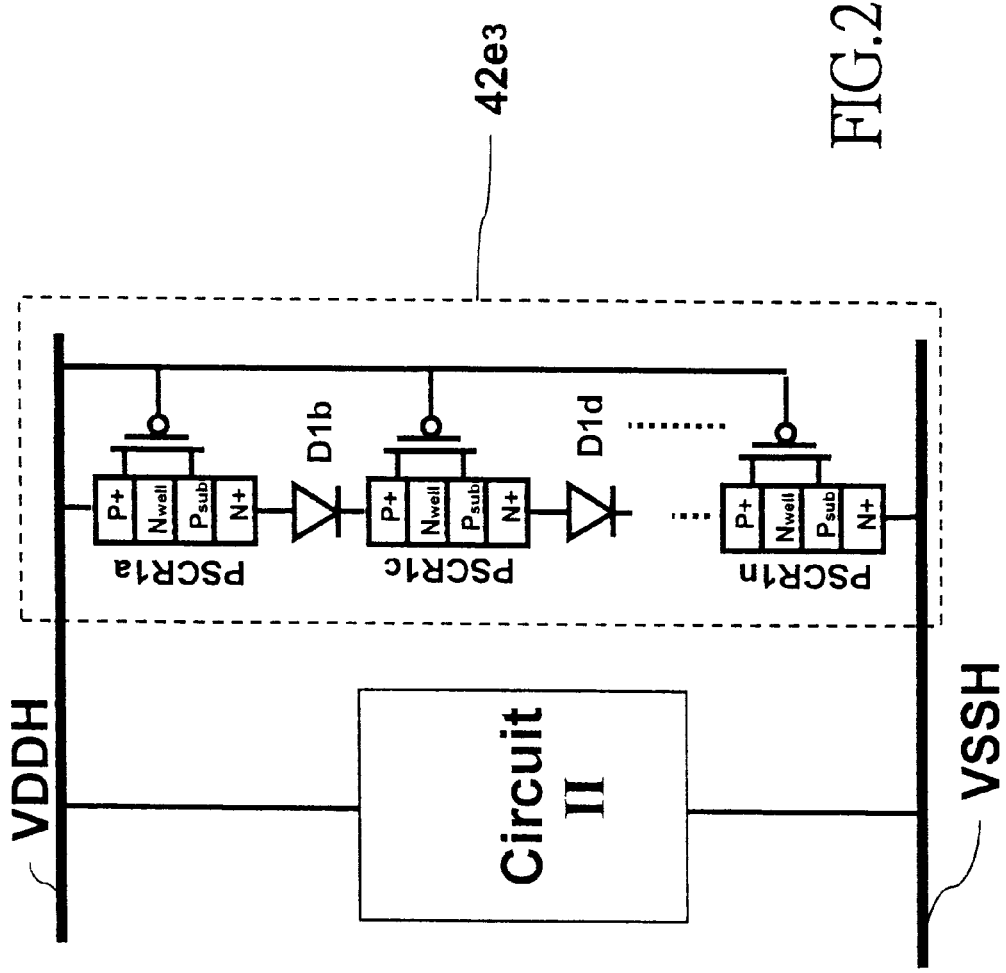
FIG. 20e illustrates an ESD clamp with PSCR's and diodes added between in accordance with the present invention.

For ESD protection circuit with PSCR's, the diodes can be added in similar with above-illustrated construction for NSCR's in FIG. 12. Turing to FIG. 17, the diodes D1b, and D1c, to D1n are added between the last cathode and the second voltage source VDDL in the first string 31f1, so as the first string 33f1. A diode Dn2a is used as the second string 31f2 and another diode Dn4a is used as the second string 33f2. The device structures of the PSCR1a with the diode string are shown in FIG. 18. In FIG. 19, the diodes (D1a, and D1b, to D1n) are inserted between every two PSCR's to form the first string 31g1. The first string 33g1 for the low-state power supplies is implemented in the same way.

Figure 3A:
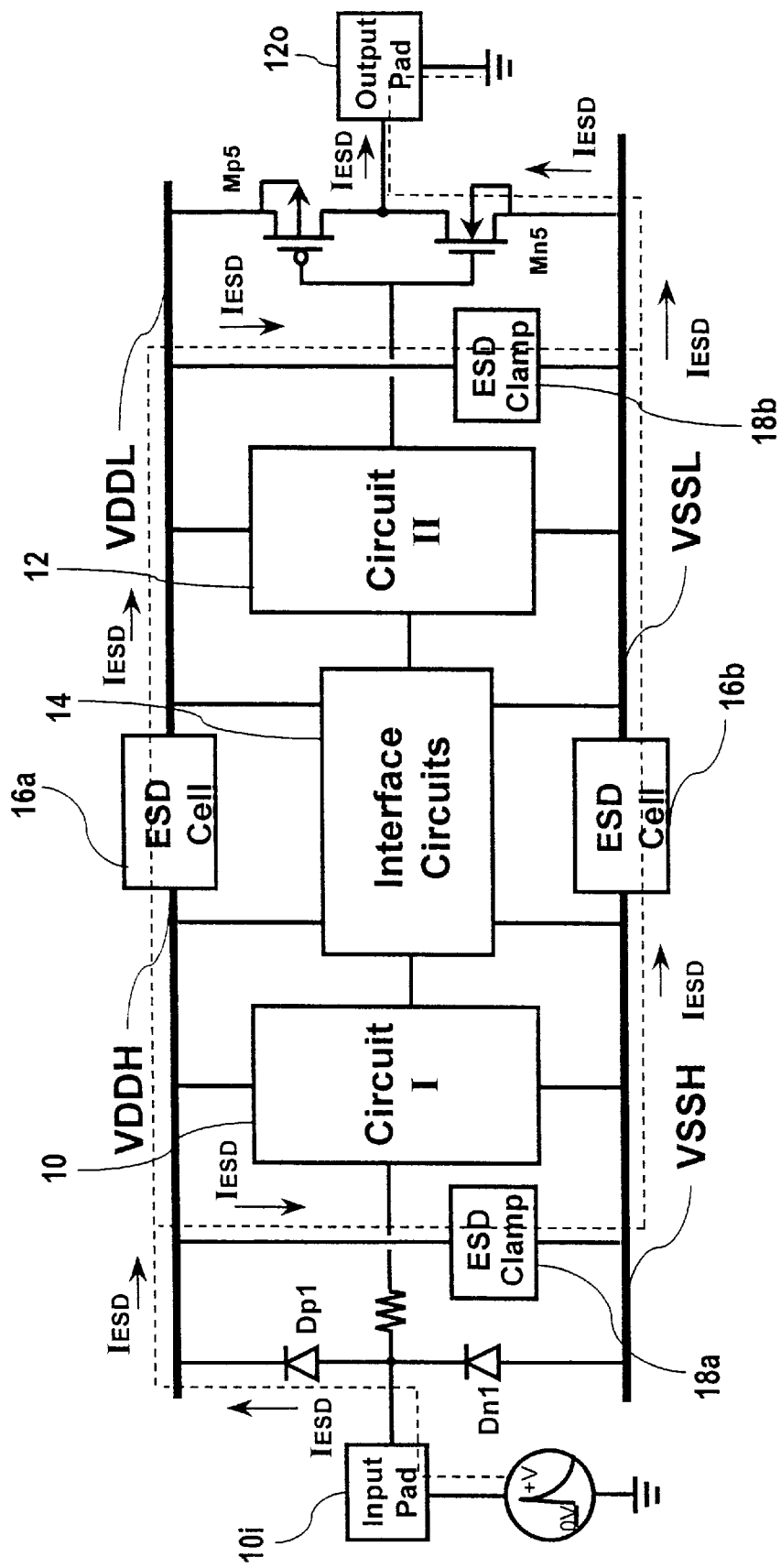
FIG. 3a illustrates the operation of the protection scheme under the pin-to-pin ESD stress from the input pin to the output pin.
Figure 3B:
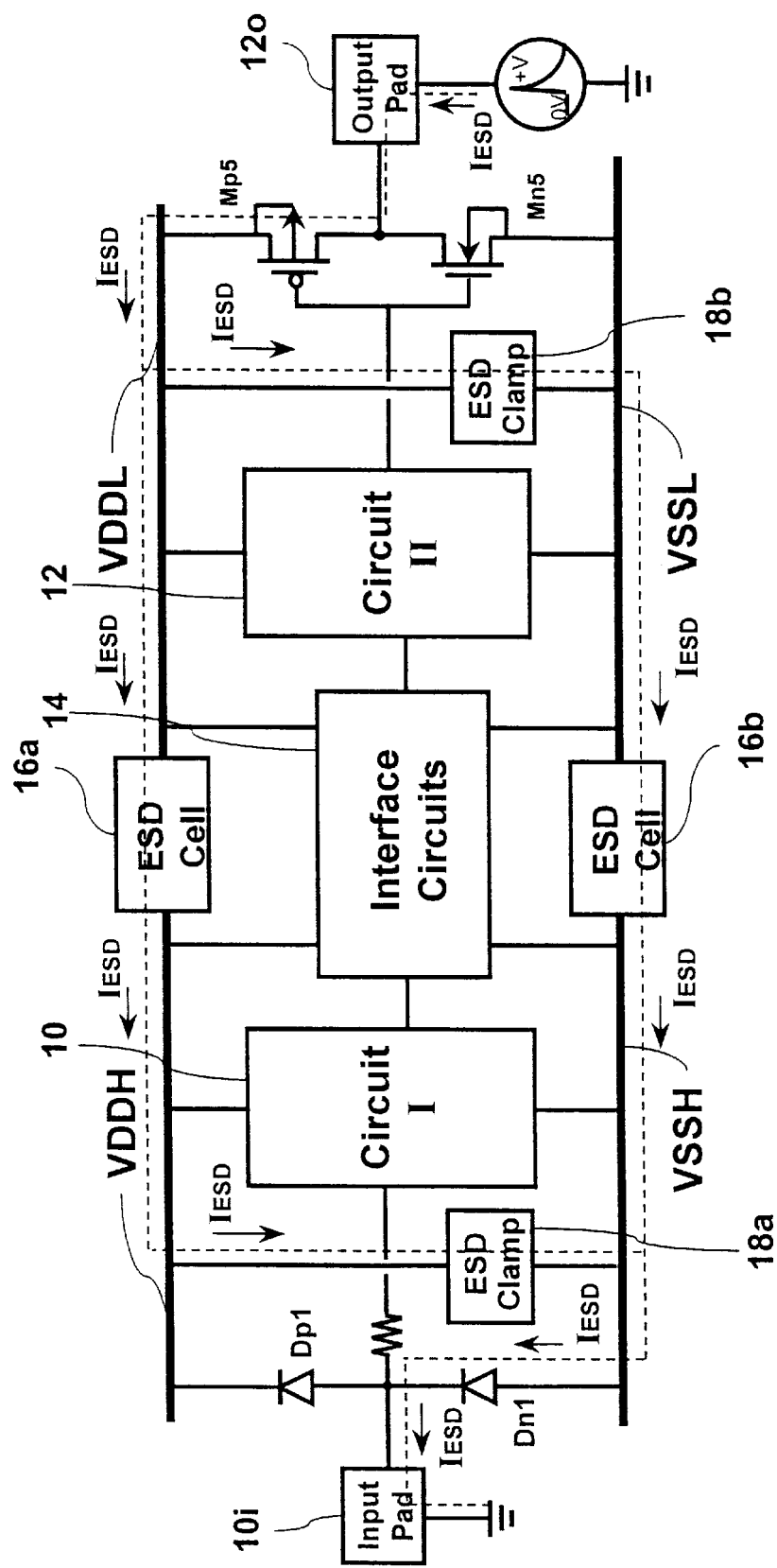
FIG. 3b illustrates the operation of the protection scheme under the pin-to-pin ESD stress from the output pin to the input pin.
Figure 4:
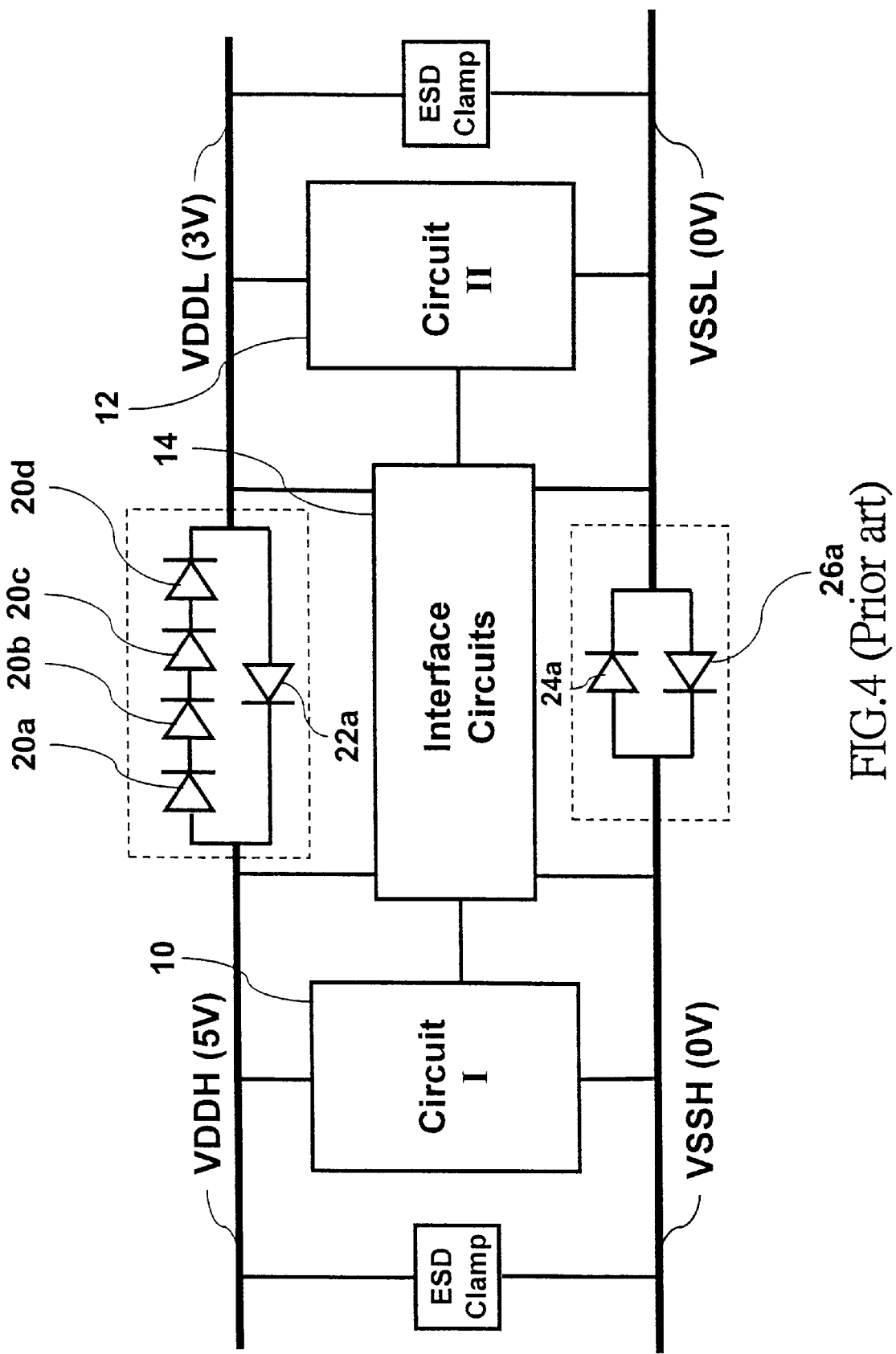
FIG. 4 illustrates a prior design of ESD cell using diode string.
Figure 5:
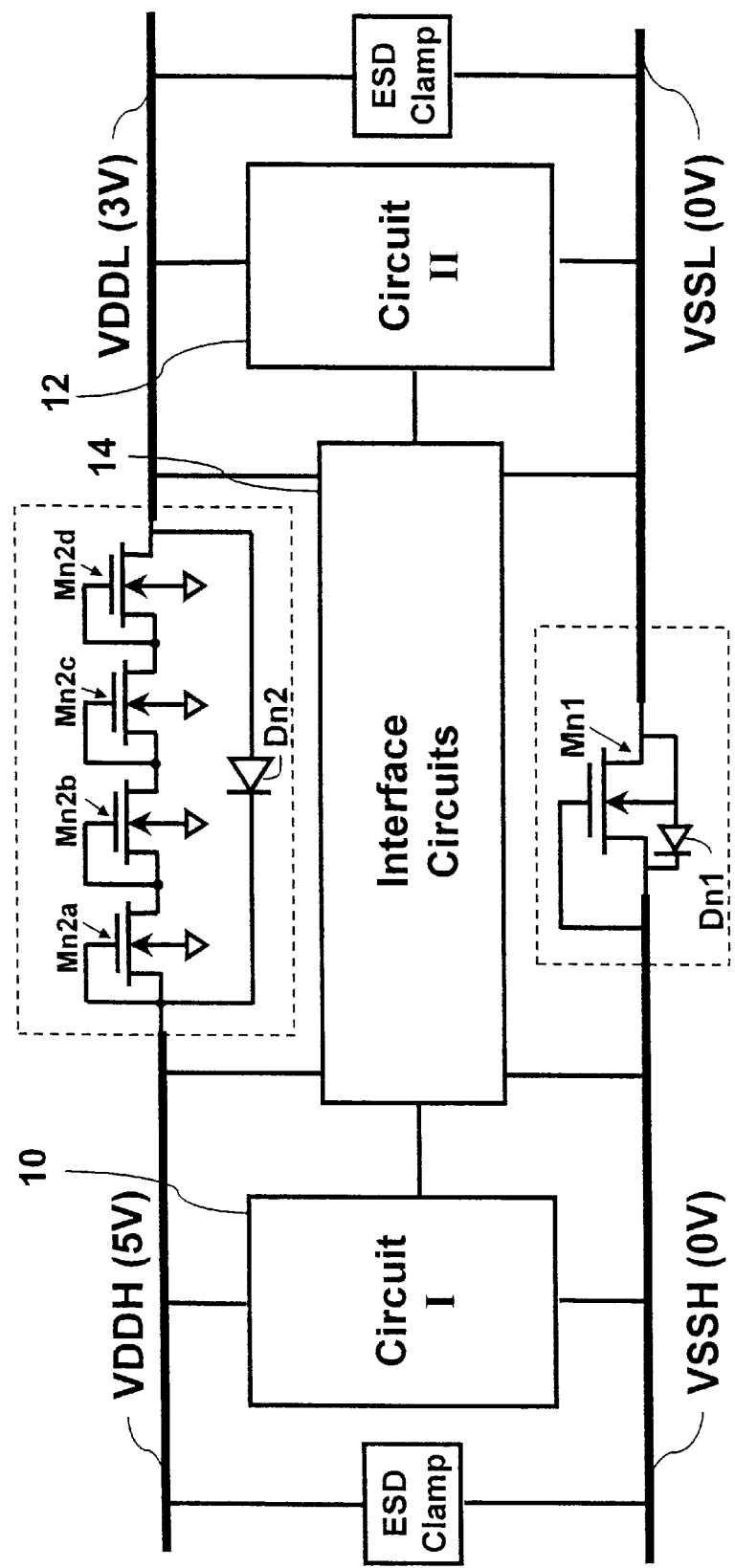
FIG. 5 illustrates a prior design of ESD cell using NMOS string.
Figure 6:
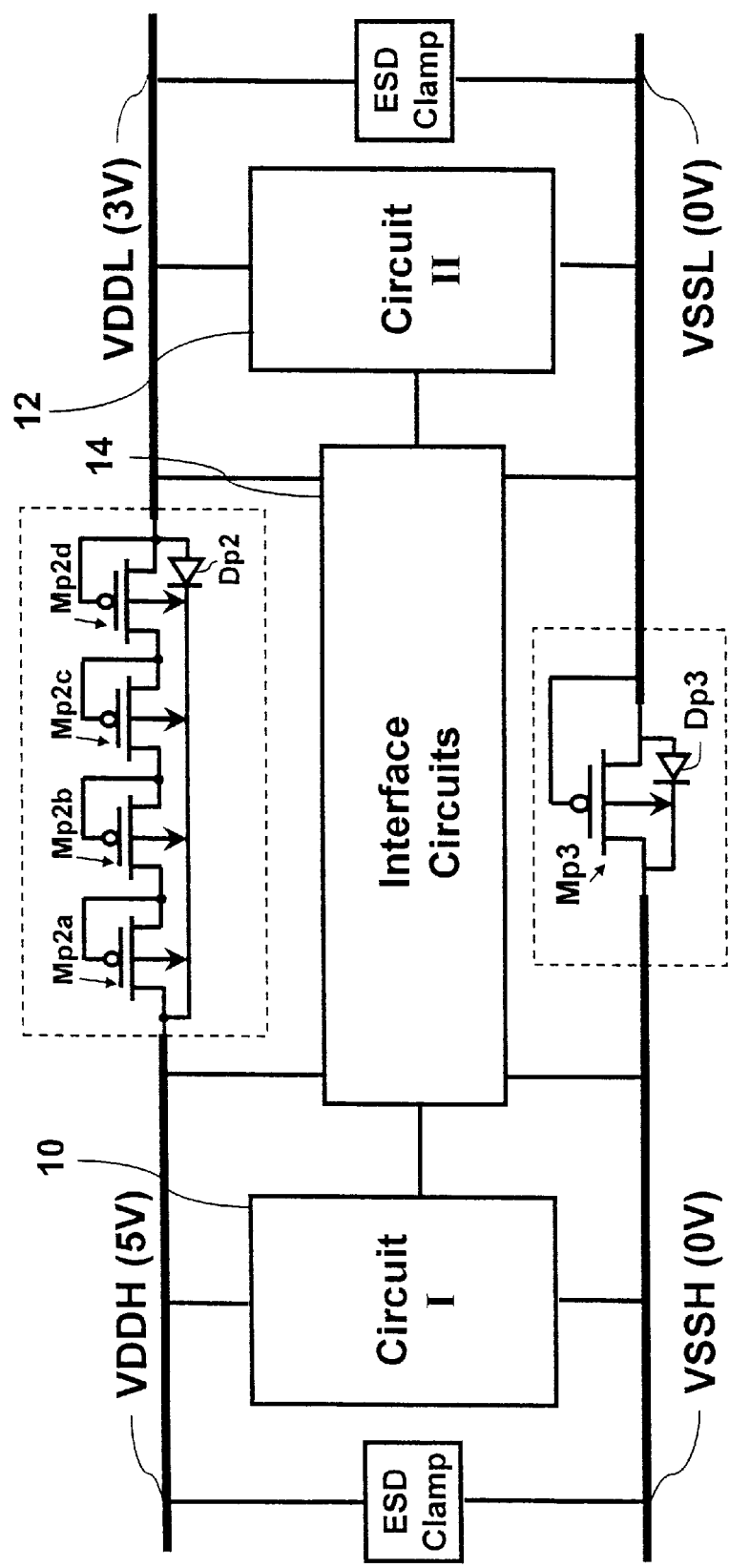
FIG. 6 illustrates a prior design of ESD cell using PMOS string.
Figure 7:
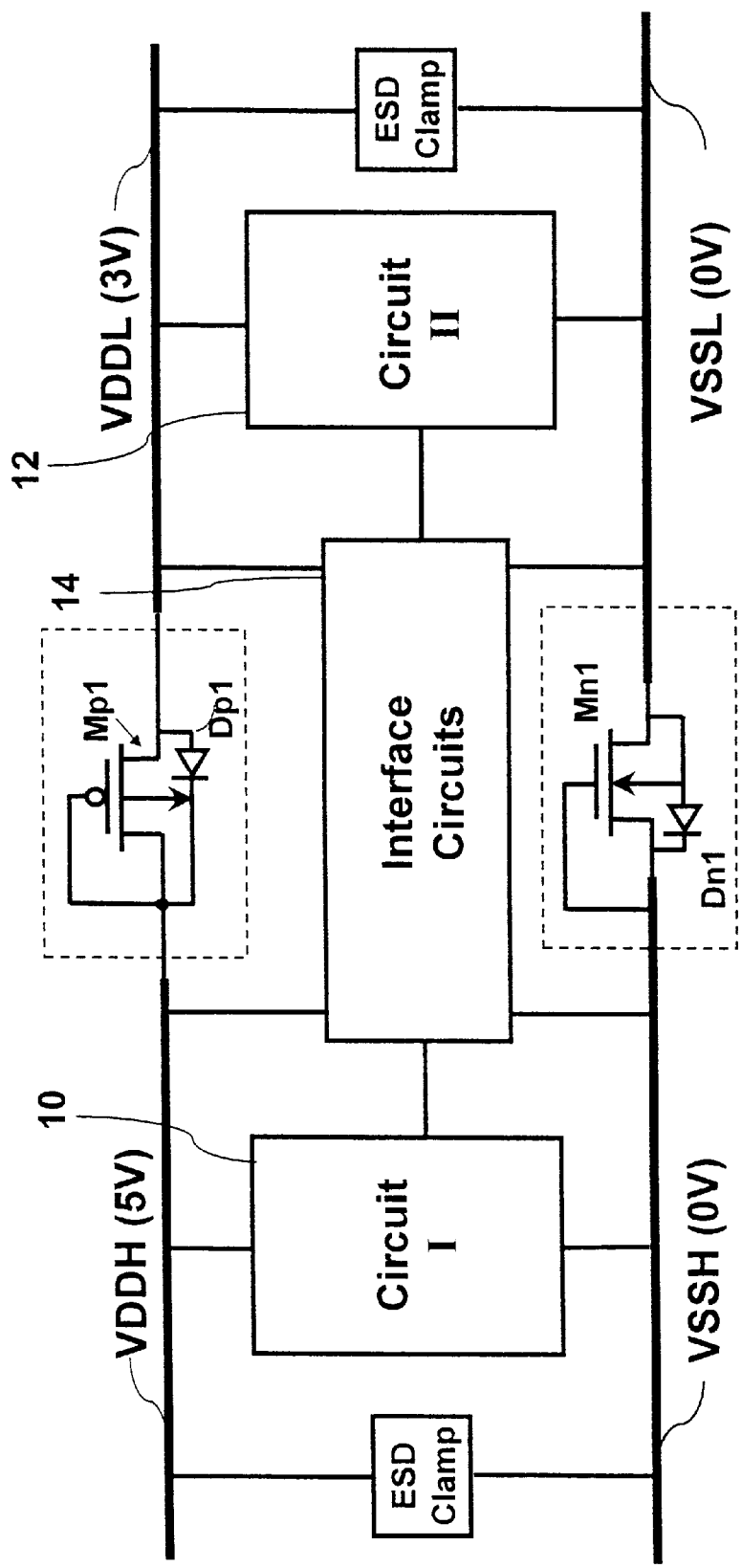
FIG. 7 illustrates a prior design of ESD cell using a PMOS with its parasitic drain-to-bulk diode.
Figure 8:
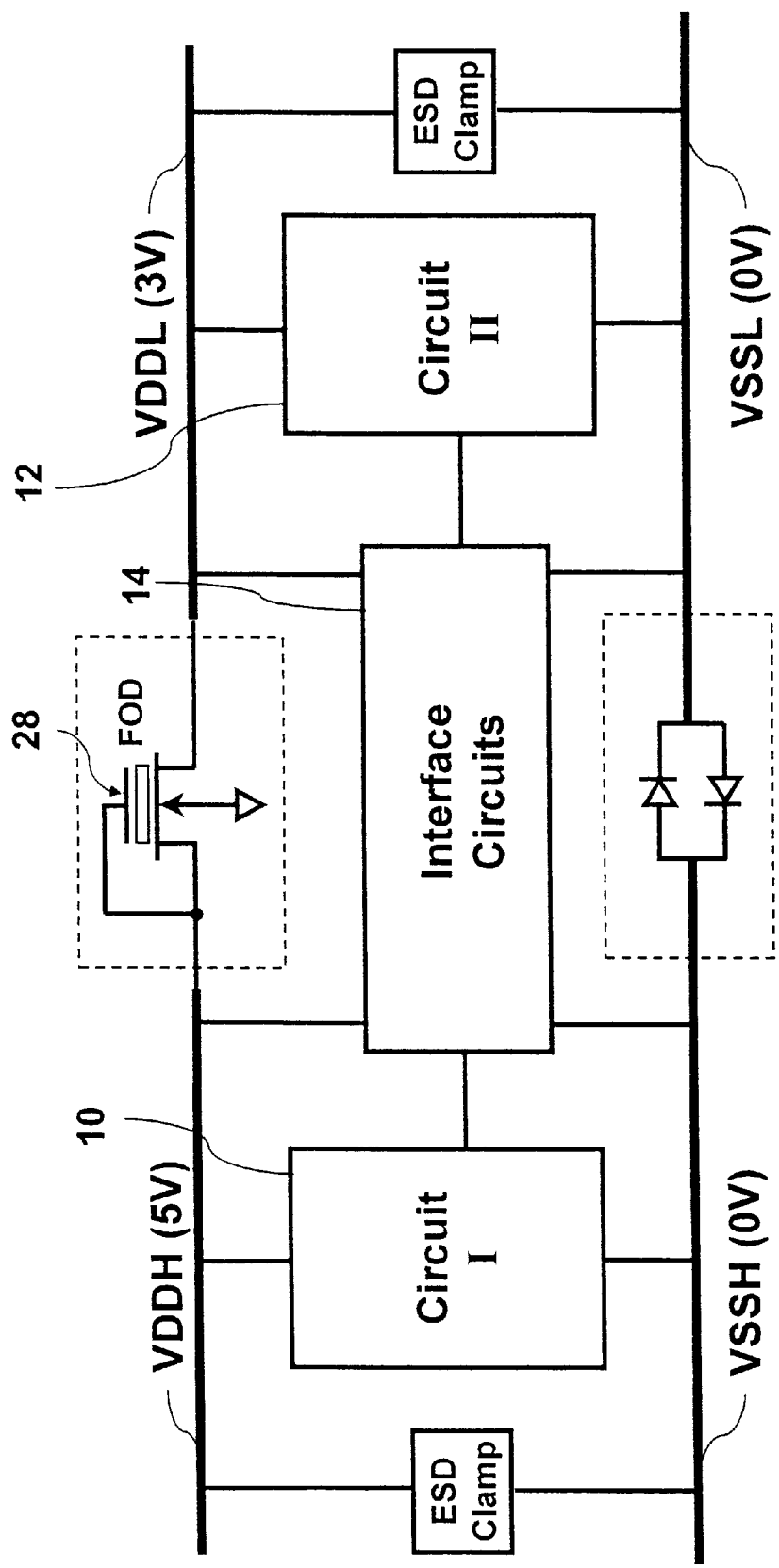
FIG. 8 illustrates a prior design of ESD cell using a field-oxide device.

Turning to FIG. 9, to perform the whole-chip ESD protection scheme for the mixed-voltage CMOS IC, the ESD clamps 40e and 42e have to be placed between VDDH and VSSH and between VDDH and VDDL. The ESD clamps 40e and 42e provide the ESD current discharging paths both from VDDH to VSSH and from VDDL to VSSL power lines, as shown in FIG. 3a and FIG. 3b. The SCR string of the present invention can be also used to realize the ESD clamps between VDDH to VSSH and VDDL to VSSL power lines. The application examples are shown in FIG. 20a through FIG. 20e. Since the SCR string or the SCR/diode-mixed string can be used to block the VDDH and VDDL of different power supplies, they can be also used as the ESD clamps from the VDDH to VSSH and VDDL to VSSL as well.

A whole-chip ESD protection scheme with the SCR string or the SCR/diode-mixed string are proposed to protect the mixed-voltage CMOS IC's with separated power lines against the ESD damage located at the interface circuits. The SCR string or the SCR/diode-mixed string are placed between the separated power lines of the mixed-voltage CMOS IC to provide the ESD current discharging paths between the separated power lines. The ESD current is arranged to be discharged through the SCR string of the SCR/diode-mixed string and the ESD clamps between the separated power lines. Therefore, the internal circuits and the interface circuits between the circuits with different power supplies can be away from the ESD damages.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. An electrostatic discharge protection circuit comprising:
    a first voltage source;
    a second voltage source; and
    at least one first SCR (silicon controlled rectifier) consisting of a lateral first SCR with an inserted first triggering MOS (metal oxide semiconductor) transistor, said at least one first SCR coupled in series by coupling a cathode of one of said at least one first SCR to an anode of next one of said at least one first SCR, a first anode of said at least one first SCR being coupled to said first voltage source and a last cathode of said at least one first SCR being coupled to said second voltage source, each of said at least one first SCR having an anode coupled with a control gate for NSCR's (NMOS-triggering SCR's), and having a cathode coupled with a control gate for PSCR's (PMOS-triggering SCR's).

2. The electrostatic discharge protection circuit of claim 1 further comprises at least one diode coupled in parallel with said at least one first SCR, said at least one diode being coupled in series, a first p-junction of said at least one diode being coupled to said second voltage source and a last n-junction of said at least one diode being coupled to said first voltage source.

3. The electrostatic discharge protection circuit of claim 1 further comprises at least one diode coupled between said at least one first SCR, each of said at least one diode being coupled by connecting a p-junction to a cathode of a previous SCR and connecting a n-junction to an anode of a next SCR.

4. The electrostatic discharge protection circuit of claim 1 further comprises at least one diode coupled in series between said second voltage source and said last cathode, said at least one diode being coupled in series, a first p-junction of said at least one diode being coupled to said last cathode and a last n-junction of said at least one diode being coupled to said second voltage source.

5. The electrostatic discharge protection circuit of claim 1 further comprises at least one diode coupled in series between said first voltage source and said first anode, said at least one diode being coupled in series, a first p-junction of said at least one diode being coupled to said first voltage source and a last n-junction of said at least one diode being coupled to said first anode.

6. The electrostatic discharge protection circuit of claim 1, wherein said first SCR is a LVTSCR (low-voltage triggering SCR) being constructed without employing a bipolar junction transistor and a resistor.

7. The electrostatic discharge protection circuit of claim 1, wherein said first voltage source and said second voltage source are two low-state voltage sources of a mixed-voltage circuit having high-state voltage sources and said low-state voltage sources.

8. The electrostatic discharge protection circuit of claim 7, wherein said mixed-voltage circuit has an electrostatic discharge clamp between said high-state voltage sources and said low-state voltage sources.

9. The electrostatic discharge protection circuit of claim 1 further comprises at least one second SCR coupled in parallel with said at least one first SCR, said second SCR (silicon controlled rectifier) consisting of a second lateral SCR with an inserted second triggering MOS (metal oxide semiconductor) transistor, said at least one second SCR coupled in series by coupling a cathode of one of said at least one second SCR to an anode of next one of said at least one second SCR, a first anode of said at least one second SCR being coupled to said second voltage source and a last cathode of said at least one second SCR being coupled to said first voltage source, each of said at least one second SCR having an anode coupled with a control gate for said NSCR's, and having a cathode coupled with a control gate for said PSCR's.

10. The electrostatic discharge protection circuit of claim 9, wherein said second SCR is a LVTSCR (low-voltage triggering SCR) being constructed without employing a bipolar junction transistor and a resistor.

11. The electrostatic discharge protection circuit of claim 1, wherein said first voltage source and said second voltage source are two high-state voltage sources of a mixed-voltage circuit having said high-state voltage sources and low-state voltage sources, said first voltage source having a higher voltage than said second voltage source.

12. The electrostatic discharge protection circuit of claim 11, wherein said mixed-voltage circuit has an electrostatic discharge clamp between said high-state voltage sources and said low-state voltage sources.

13. An electrostatic discharge protection circuit comprising:
a first voltage source;
a second voltage source;
at least one first SCR (silicon controlled rectifier) consisting of a lateral first SCR with an inserted first triggering MOS (metal oxide semiconductor) transistor without employing a bipolar junction transistor and a resistor, said at least one first SCR coupled in series by coupling a cathode of one of said at least one first SCR to an anode of next one of said at least one first SCR, a first anode of said at least one first SCR being coupled to said first voltage source and a last cathode of said at least one first SCR being coupled to said second voltage source, each of said at least one first SCR having an anode coupled with a control gate for NSCR's (NMOS-triggering SCR's), and having a cathode coupled with a control gate for PSCR's (PMOS-triggering SCR's); and
at least one parallel diode coupled in parallel with said at least one first SCR, said at least one parallel diode being coupled in series, a first p-junction of said at least one parallel diode being coupled to said second voltage source and a last n-junction of said at least one parallel diode being coupled to said first voltage source.

14. The electrostatic discharge protection circuit of claim 13 further comprises at least one diode coupled between said at least one first SCR, each of said at least one diode being coupled by connecting a p-junction to a cathode of a previous SCR and connecting a n-junction to an anode of a next SCR.

15. The electrostatic discharge protection circuit of claim 13 further comprises at least one diode coupled in series between said second voltage source and said last cathode, said at least one diode being coupled in series, a first p-junction of said at least one diode being coupled to said last cathode and a last n-junction of said at least one diode being coupled to said second voltage source.

16. The electrostatic discharge protection circuit of claim 13 further comprises at least one diode coupled in series between said first voltage source and said first anode, said at least one diode being coupled in series, a first p-junction of said at least one diode being coupled to said first voltage source and a last n-junction of said at least one diode being coupled to said first anode.

17. The electrostatic discharge protection circuit of claim 13, wherein said first voltage source and said second voltage source are two high-state voltage sources of a mixed-voltage circuit having said high-state voltage sources and low-state voltage sources, said first voltage source having a higher voltage than said second voltage source.

18. The electrostatic discharge protection circuit of claim 17, wherein said mixed-voltage circuit has an electrostatic discharge clamp between said high-state voltage sources and said low-state voltage sources.

19. The electrostatic discharge protection circuit of claim 13, wherein said first voltage source and said second voltage source are two low-state voltage sources of a mixed-voltage circuit having high-state voltage sources and said low-state voltage sources.

20. The electrostatic discharge protection circuit of claim 19, wherein said mixed-voltage circuit has an electrostatic discharge clamp between said high-state voltage sources and said low-state voltage sources.

21. An electrostatic discharge protection circuit comprising:
a first voltage source;
a second voltage source, wherein said first voltage source and said second voltage source are two high-state voltage sources of a mixed-voltage circuit having said high-state voltage sources and low-state voltage sources, said first voltage source having a higher voltage than said second voltage source;
at least one first SCR (silicon controlled rectifier) consisting of a lateral first SCR with an inserted first triggering MOS (metal oxide semiconductor) transistor without employing a bipolar junction transistor and a resistor, said at least one first SCR coupled in series by coupling a cathode of one of said at least one first SCR to an anode of next one of said at least one first SCR, a first anode of said at least one first SCR being coupled to said first voltage source and a last cathode of said at least one first SCR being coupled to said second voltage source, each of said at least one first SCR having an anode coupled with a control gate for NSCR's (NMOS-triggering SCR's), and having a cathode coupled with a control gate for PSCR's (PMOS-triggering SCR's);
at least one parallel diode coupled in parallel with said at least one first SCR, said at least one parallel diode being coupled in series, a first p-junction of said at least one parallel diode being coupled to said second voltage source and a last n-junction of said at least one parallel diode being coupled to said first voltage source; and
an electrostatic discharge clamp between said high-state voltage sources and said low-state voltage sources.

22. The electrostatic discharge protection circuit of claim 21 further comprises at least one diode coupled between said at least one first SCR, each of said at least one diode being coupled by connecting a p-junction to a cathode of a previous SCR and connecting a n-junction to an anode of a next SCR.

23. The electrostatic discharge protection circuit of claim 21 further comprises at least one diode coupled in series between said second voltage source and said last cathode, said at least one diode being coupled in series, a first p-junction of said at least one diode being coupled to said last cathode and a last n-junction of said at least one diode being coupled to said second voltage source.

24. The electrostatic discharge protection circuit of claim 21 further comprises at least one diode coupled in series between said first voltage source and said first anode, said at least one diode being coupled in series, a first p-junction of said at least one diode being coupled to said first voltage source and a last n-junction of said at least one diode being coupled to said first anode.

* * * * *